US011049455B2

(12) United States Patent
Kim et al.

(10) Patent No.: US 11,049,455 B2
(45) Date of Patent: Jun. 29, 2021

(54) DISPLAY DEVICE, ELECTRONIC DEVICE, AND TOGGLING CIRCUIT

(71) Applicant: LG Display Co., Ltd., Seoul (KR)

(72) Inventors: Beom-Jin Kim, Seoul (KR); Gyungmin Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 10 days.

(21) Appl. No.: 16/054,263

(22) Filed: Aug. 3, 2018

(65) Prior Publication Data

US 2019/0051246 A1 Feb. 14, 2019

(30) Foreign Application Priority Data

Aug. 9, 2017 (KR) ........................ 10-2017-0101331

(51) Int. Cl.

| | |
|---|---|
| ***G09G 3/3258*** | (2016.01) |
| ***G09G 3/3208*** | (2016.01) |
| ***G09G 3/3225*** | (2016.01) |
| ***G09G 3/36*** | (2006.01) |
| ***G09G 3/3266*** | (2016.01) |
| ***H01L 51/52*** | (2006.01) |

(52) U.S. Cl.

CPC ......... *G09G 3/3258* (2013.01); *G09G 3/3208* (2013.01); *G09G 3/3225* (2013.01); *G09G 3/3266* (2013.01); *G09G 3/3648* (2013.01); *H01L 51/5203* (2013.01); *G09G 2230/00* (2013.01); *G09G 2310/0243* (2013.01); *G09G 2310/0286* (2013.01); *G09G 2320/0261* (2013.01)

(58) Field of Classification Search

CPC ............... G09G 3/3258; G09G 3/3266; G09G 2310/0286; G09G 3/3655; G06F 3/1423

See application file for complete search history.

(56) References Cited

U.S. PATENT DOCUMENTS

| | | | | |
|---|---|---|---|---|
| 9,570,009 B2 | 2/2017 | Woo et al. | | |
| 2004/1035521 | 7/2004 | Park | | |
| 2010/0085341 A1* | 4/2010 | Hasegawa | ............ | G09G 3/3233 345/208 |
| 2010/0091006 A1* | 4/2010 | Yoo | ...................... | G09G 3/3233 345/213 |
| 2010/0091207 A1* | 4/2010 | Hasegawa | ............. | G09G 3/003 349/15 |

(Continued)

FOREIGN PATENT DOCUMENTS

| | | |
|---|---|---|
| CN | 104036698 A | 9/2014 |
| CN | 104715718 A | 6/2015 |

(Continued)

OTHER PUBLICATIONS

Office Action dated Feb. 1, 2019 issued in the corresponding United Kingdom Patent Application No. 1812620.1, pp. 1-8.

(Continued)

*Primary Examiner* — Yuzhen Shen

(74) *Attorney, Agent, or Firm* — Polsinelli PC

(57) ABSTRACT

Disclosed are a display device, an electronic device, and a toggling circuit, which can reduce or prevent a motion blur phenomenon without a significant change in the performance of an interface, a controller, or a source-driving circuit by toggling driving voltages and individually executing driving voltage lines.

20 Claims, 23 Drawing Sheets

(56) References Cited

U.S. PATENT DOCUMENTS

| | | | | |
|---|---|---|---|---|
| 2010/0207968 | A1* | 8/2010 | Kim | G09G 3/3266 345/691 |
| 2011/0128272 | A1 | 6/2011 | Chen et al. | |
| 2011/0193892 | A1* | 8/2011 | Eom | G09G 3/3266 345/690 |
| 2012/0105412 | A1* | 5/2012 | Kang | G09G 3/3233 345/211 |
| 2012/0139886 | A1* | 6/2012 | Lee | G09G 3/3677 345/209 |
| 2013/0002736 | A1* | 1/2013 | Park | G09G 3/3225 345/691 |
| 2014/0253502 | A1* | 9/2014 | Cho | G06F 3/0412 345/174 |
| 2014/0347259 | A1 | 11/2014 | Hsu et al. | |
| 2015/0177522 | A1* | 6/2015 | Yajima | G09G 3/3208 345/8 |
| 2016/0086549 | A1* | 3/2016 | Eom | G09G 3/003 345/690 |
| 2016/0133185 | A1* | 5/2016 | Yoon | G09G 3/3233 345/76 |
| 2016/0275845 | A1* | 9/2016 | Tsai | G09G 3/3266 |
| 2017/0103724 | A1 | 4/2017 | Chen et al. | |
| 2017/0185220 | A1* | 6/2017 | Lee | G06F 3/0416 |
| 2017/0206837 | A1* | 7/2017 | Jeon | G09G 3/3275 |
| 2018/0211596 | A1* | 7/2018 | Gu | G09G 3/3258 |

FOREIGN PATENT DOCUMENTS

| | | | |
|---|---|---|---|
| KR | 20120068673 | A | 6/2012 |
| KR | 20120115694 | A | 10/2012 |
| KR | 20130014754 | A | 2/2013 |
| TW | 201124974 | A | 7/2011 |

OTHER PUBLICATIONS

Office Action dated Apr. 28, 2021 issued in corresponding Chinese Patent Application No. 201810878018.X w/English Translation (24 pages).

* cited by examiner

DISPLAY DEVICE, ELECTRONIC DEVICE, AND TOGGLING CIRCUIT

CROSS REFERENCE TO RELATED APPLICATION

This application claims priority from Korean Patent Application No. 10-2017-0101331, filed on Aug. 9, 2017, which is hereby incorporated by reference in its entirety for all purposes as if fully set forth herein.

BACKGROUND

Field of the Disclosure

The present disclosure relates to a display device, an electronic device, and a toggling circuit.

Description of the Background

With the development of the information-oriented society, demand for display devices for displaying images in various forms has increased, and recently, a variety of display devices, such as liquid crystal display devices, plasma display devices and organic light-emitting display devices, have come to be used.

Meanwhile, all or some portion of a previous frame screen may appear on the current frame screen. For example, when an object moving at a high speed in an image is expressed, the object may appear to be distorted. Such a phenomenon is called "motion blur".

In order to remove such motion blur, it is required to increase a frame rate and decrease image persistence.

However, due to various constraints on an interface speed, an operation speed of a controller, and an operation speed of a source-driving circuit, there is limit on the extent to which the frame rate can be increased or image persistence can be decreased. Accordingly, a limit on reducing or removing motion blur also exists.

SUMMARY

In this background, an aspect of the aspects is to provide a display device, an electronic device, and a toggling circuit, which can reduce or prevent a motion blur phenomenon, without a significant change in the performance of an interface, a controller, or a source-driving circuit.

Another aspect of the aspects is to provide a display device, an electronic device, and a toggling circuit, which have a high frame rate, a rapid response speed, and low image persistence, without a significant change in the performance of the interface, the controller, or the source-driving circuit.

Still another aspect of the aspects is to provide a display device, an electronic device, and a toggling circuit that individually drive each of a plurality of driving voltage lines.

Yet another aspect of the aspects is to provide a display device, an electronic device, and a toggling circuit that individually drive each of a plurality of driving voltage lines using toggled driving voltages.

Still yet another aspect of the aspects is to provide a display device, an electronic device, and a toggling circuit through a rolling shutter-driving method, which can reduce or prevent a motion blur phenomenon.

Still a further aspect of the aspects is to provide a display device, an electronic device, and a toggling circuit through a global shutter-driving method, which can reduce or prevent a motion blur phenomenon.

In accordance with an aspect of the present disclosure, a display device is provided. The display device includes: a pixel array including a plurality of subpixels defined by a plurality of data lines and a plurality of gate lines; a source-driving circuit configured to drive the plurality of data lines; a gate-driving circuit configured to drive the plurality of gate lines; and a controller configured to control the source-driving circuit and the gate-driving circuit, wherein a plurality of driving voltage lines for transferring individual driving voltages to the plurality of subpixels is arranged in a pixel array area including the pixel array, and the driving voltages individually applied to each of the plurality of driving voltage lines are toggled.

In the display device, a plurality of driving voltage lines for transferring individual driving voltages to the plurality of subpixels may be arranged in a pixel array area including the pixel array.

The driving voltages individually applied to each of the plurality of driving voltage lines may be toggled.

Each of the plurality of driving voltage lines may be arranged one per subpixel line or one for every two or more subpixel lines.

The toggled driving voltages applied to the plurality of driving voltage lines may have different toggling timing.

The toggled driving voltages applied to the plurality of driving voltage lines may be sequentially toggled from an on-voltage to an off-voltage level state within one frame period.

The toggled driving voltages applied to the plurality of driving voltage lines may have equal toggling timing.

The toggled driving voltages applied to the plurality of driving voltage lines may be simultaneously toggled from an off-voltage level state or a floating state to an on-voltage state within one frame period.

During a predetermined period of at least one frame period, an image may not be displayed, or a fake image different from the image may be displayed.

The predetermined period during which the image is not displayed or the fake image different from the image is displayed may be synchronized with toggling timing of the driving voltage.

An area in which the image is not displayed or in which the fake image is displayed for a predetermined period may be displayed in black.

The display device may further include a toggling circuit configured to toggle a driving voltage of a DC voltage and output the toggled driving voltage.

The toggling circuit may include: an input terminal for receiving a driving voltage having a predetermined voltage value; a plurality of toggle switches connected to correspond to the plurality of driving voltage lines; and a plurality of shift registers configured to output a plurality of toggle control signals for controlling on/off operation of the plurality of toggle switches.

Each of the plurality of toggle switches may be turned on/off according to the toggle control signal, and may toggle the driving voltage of the DC voltage input to the input terminal and output the toggled driving voltage to the corresponding driving voltage line.

The toggling circuit may be arranged in an outer area of the pixel array area.

The pixel array, the source-driving circuit, the gate-driving circuit, and the controller may be arranged on a silicon substrate.

In the display device according to the aspects, an image may not be displayed, or a fake image different from the image may be displayed during a predetermined period of at least one frame period.

A plurality of driving voltage lines for transferring individual driving voltages to the plurality of subpixels may be arranged in a pixel array area including the pixel array.

The driving voltages individually applied to each of the plurality of driving voltage lines may be toggled.

The predetermined period during which the image is not displayed or the fake image different from the image is displayed may be synchronized with toggling timing of the driving voltage.

In accordance with another aspect of the present disclosure, an electronic device is provided. The electronic device may include: an image signal input unit configured to receive an image signal; a first display unit configured to display a first image based on the image signal; a second display unit configured to display a second image based on the image signal; and a case configured to accommodate the image signal input unit, the first display unit, and the second display unit.

Each of the first display unit and the second display unit may include a silicon substrate, a pixel array including a plurality of subpixels arranged on the silicon substrate, and driving circuits arranged on the silicon substrate.

The driving circuits may be located near the pixel array.

A plurality of driving voltage lines for supplying individual driving voltages to the plurality of subpixels may be arranged in an area in which the pixel array is located in each of the first display unit and the second display unit.

The individual driving voltages applied to the plurality of driving voltage lines may be toggled.

In accordance with another aspect of the present disclosure, a toggling circuit is provided. The toggling circuit includes: an input terminal configured to receive a driving voltage having a predetermined voltage value; a plurality of toggle switches connected to correspond to a plurality of driving voltage lines; and a plurality of shift registers configured to output a plurality of toggle control signals for controlling on/off operation of the plurality of toggle switches.

Each of the plurality of toggle switches may be turned on/off according to the toggle control signal, toggle the driving voltage input to the input terminal, and output the toggled driving voltage to the corresponding driving voltage line.

In accordance with another aspect of the present disclosure, a display device is provided. The display device includes: a pixel array including a plurality of subpixels defined by a plurality of data lines and a plurality of gate lines; a source-driving circuit configured to drive the plurality of data lines; a gate-driving circuit configured to drive the plurality of gate lines; and a controller configured to control the source-driving circuit and the gate-driving circuit.

In the display device, the plurality of subpixels may be grouped to a plurality of subpixel groups, and the plurality of subpixel groups may be connected to a plurality of driving voltage lines arranged in the pixel array area.

In the display device, driving voltages applied to the plurality of driving voltage lines may be controlled for each of the plurality of subpixel groups.

The display device may further include a driving voltage control circuit configured to control the driving voltages applied to the plurality of driving voltage lines.

According to the above-described aspects, it is possible to provide a display device, an electronic device, and a toggling circuit, which can reduce or prevent a motion blur phenomenon without a significant change in the performance of an interface, a controller, and a source-driving circuit.

According to the aspects, it is possible to provide a display device, an electronic device, and a toggling circuit, which have a high frame rate, a rapid response speed, and low image persistence, without a significant change in the performance of the interface, the controller, and the source-driving circuit.

According to the aspects, it is possible to provide a display device, an electronic device, and a toggling circuit that individually drive each of a plurality of driving voltage lines.

According to the aspects, it is possible to provide a display device, an electronic device, and a toggling circuit that individually drive each of a plurality of driving voltage lines using toggled driving voltages.

According to the aspects, it is possible to provide a display device, an electronic device, and a toggling circuit through a rolling shutter-driving method, which can reduce or prevent a motion blur phenomenon.

According to the aspects, it is possible to provide a display device, an electronic device, and a toggling circuit through a global shutter-driving method, which can reduce or prevent a motion blur phenomenon.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
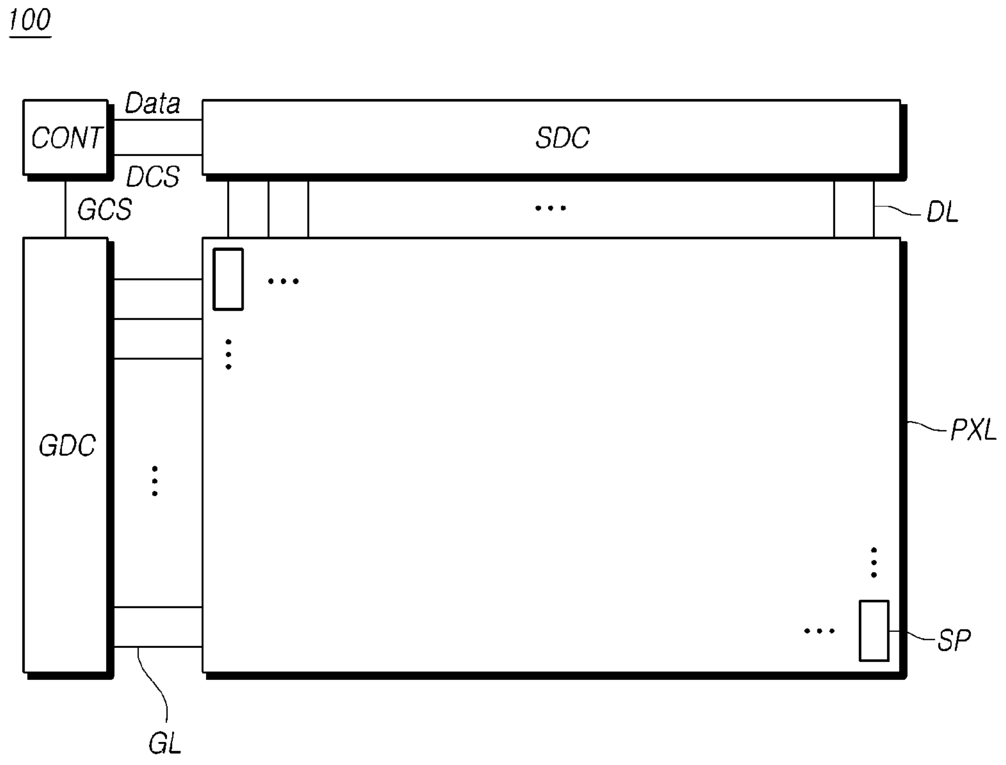
FIG. 1 illustrates the configuration of a system of a display device according to aspects of the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Aspects disclose a circuit and a display device for providing a driving method of preventing dizziness that the user feels due to motion blur and an electronic device using the display device, with the goal of providing the user with realistic virtual reality or augmented reality without any inconvenience.

Further, aspects may provide a display device including a pixel array comprising a plurality of subpixels defined by a plurality of data lines and a plurality of gate lines, a source-driving circuit configured to drive the plurality of data lines, a gate-driving circuit configured to drive the plurality of gate lines, and a controller configured to control the source-driving circuit and the gate-driving circuit.

In the display device, the plurality of subpixels may be grouped into a plurality of subpixel groups, and the plurality of subpixel groups may be connected to a plurality of driving voltage lines arranged in the pixel array area.

Each subpixel group is a set of subpixels that may receive a driving voltage from one driving voltage line. For example, when subpixels arranged on a first row and subpixels arranged on a second row receive a driving voltage from one driving voltage line in common, the subpixels arranged on the first row and the subpixels arranged on the second row may be considered as subpixels belonging to one subpixel group.

In the display device, driving voltages applied to a plurality of driving voltage lines may be controlled for each of a plurality of subpixel groups.

The display device may further include a driving voltage control circuit for controlling driving voltages applied to the plurality of driving voltage lines. The driving voltage control circuit may be or include a toggling circuit (TOG) described below and may further include a power supply circuit (PSC).

Hereinafter, the display device, the driving voltage control circuit of which has been briefly described above, and an electronic device using the same will be described in detail based on examples.

Meanwhile, the display device according to the aspects may be any of various types of display, such as a liquid crystal display device, a plasma display device, and an organic light-emitting display device. However, hereinafter, the display device will be described as the organic light-emitting display device.

FIG. 1 is a configuration diagram illustrating a system of a display device 100 according to the present disclosure.

Referring to FIG. 1, the display device 100 according to the present disclosure includes a pixel array (PXL) on which a plurality of data lines (DLs) and a plurality of gate lines (GL) are arranged and which includes a plurality of subpixels (SP) defined by the plurality of data lines (DL) and the plurality of gate lines (GL), a source-driving circuit (SDC) for driving the plurality of data lines (DL), a gate-driving circuit (GDC) for driving the plurality of gate lines (GL), and a controller (CONT) for controlling the source-driving circuit (SDC) and the gate-driving circuit (GDC).

The controller (CONT) controls the source-driving circuit (SDC) and the gate-driving circuit (GDC) by supplying various control signals (DCS and GCS) to the source-driving circuit (SDC) and the gate-driving circuit (GDC).

The controller (CONT) starts a scan according to the timing implemented in each frame, switches input image data received from the outside to fit the data signal format used by the source-driving circuit (SDC), outputs the switched image data (Data), and controls data driving at a suitable time based on the scan.

The controller (CONT) may be a timing controller used in general display technology or a control device that includes such a timing controller and further performs other control functions.

The controller (CONT) may be implemented as an element separate from the source-driving circuit (SDC), or may be integrated with the source-driving circuit (SDC) and implemented as an integrated circuit.

The source-driving circuit (SDC) drives the plurality of data lines (DL) by receiving image data (Data) from the controller (CONT) and supplying a data voltage to the plurality of data lines (DL). The source-driving circuit (SDC) is also called a data-driving circuit.

The source-driving circuit (SDC) may be implemented so as to include at least one Source Driver Integrated Circuit (SDIC).

Each source driver integrated circuit (SDIC) may include a shift register, a latch circuit, a Digital-to-Analog Converter (DAC), an output buffer, and the like.

Each source driver integrated circuit (SDIC) may further include an Analog-to-Digital Converter (ADC) according to the circumstances.

The gate-driving circuit (GDC) sequentially drives the plurality of gate lines (GL) by sequentially driving scan signals to the plurality of gate lines (GL). The gate-driving circuit (GDC) is also called a scan-driving circuit.

The gate-driving circuit (GDC) may be implemented to include at least one Gate Driver Integrated Circuit (GDIC).

Each GDIC may include a shift register, a level shifter, and the like.

The gate-driving circuit (GDC) sequentially supplies scan signals of an on voltage or an off voltage to the plurality of gate lines (GL) under the control of the controller (CONT).

When a particular gate line is opened by the gate-driving circuit (GDC), the source-driving circuit (SDC) converts the image data (DATA) received from the controller (CONT) into an analog-type data voltage and supplies the data voltage to the plurality of data lines (DL).

The source-driving circuit (SDC) may be located only on one side (for example, the upper side or lower side) of the pixel array (PXL), or may be located on both sides (for example, the upper side and the lower side) of the pixel array (PXL) according to a driving scheme or a panel design type in some cases.

The gate-driving circuit (GDC) may be located only on one side (for example, the left side or the right side) of the pixel array (PXL), or may be located on both sides (for example, the left side and the right side) of the pixel array (PXL) according to a driving scheme or a panel design type in some cases.

The type and number of circuit elements included in each subpixel (SP) may be variously determined according to a provided function and a design type.

Meanwhile, the pixel array (PXL) may exist on a display panel using a glass substrate, and the source-driving circuit (SDC) and the gate-driving circuit (GDC) may be electrically connected to the display panel in various ways.

That is, in the display device 100, transistors, various electrodes, and various signal lines are formed on the glass substrate to form the pixel array (PXL), and integrated circuits corresponding to driving circuits are mounted on a printed circuit and electrically connected to the display panel through the printed circuit. Such a conventional structure is suitable for medium and large-sized display devices.

Meanwhile, the display device 100 according to the aspects may be a small-sized display device having a structure suitable for application to electronic devices, such as a virtual-reality device or an augmented-reality device, or having excellent display performance.

In this case, for example, the pixel array (PXL), the source-driving circuit (SDC), the gate-driving circuit (GDC), and the controller (CONT) may be disposed on a silicon substrate (silicon semiconductor substrate) together.

In this case, the display device 100 may be manufactured to be very small, and may be used for electronic devices such as a Virtual-Reality (VR) device or an Augmented-Reality (AR) device.

Figure 2:
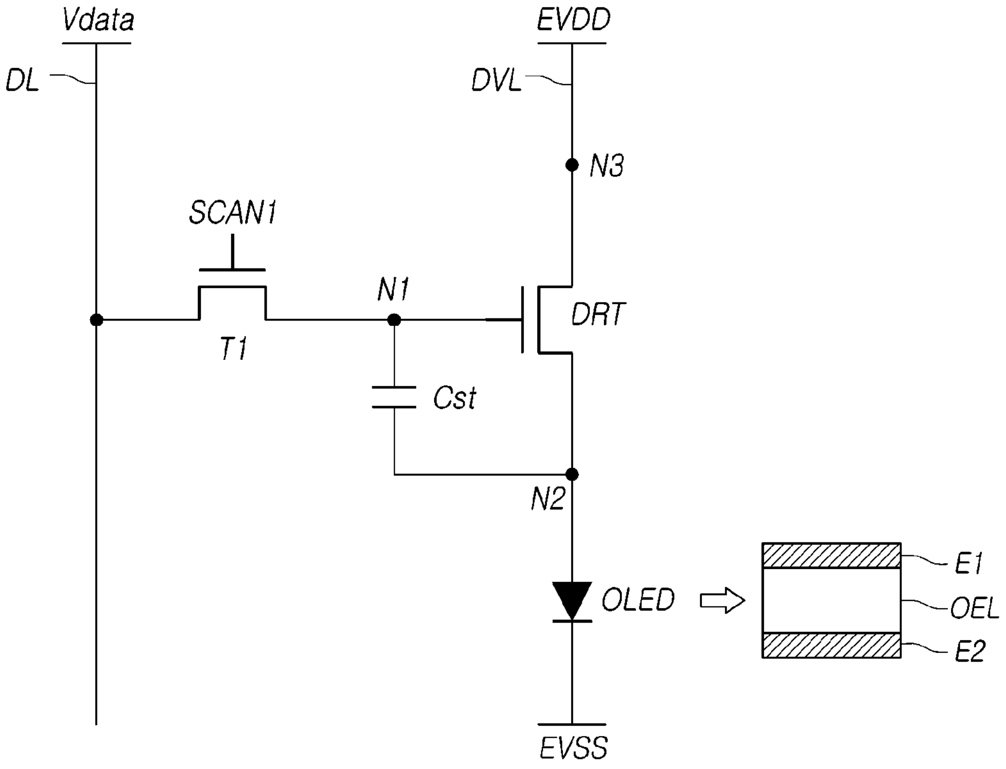
FIG. 2 illustrates a structure of a subpixel of a display device according to aspects of the present disclosure.
Figure 3:
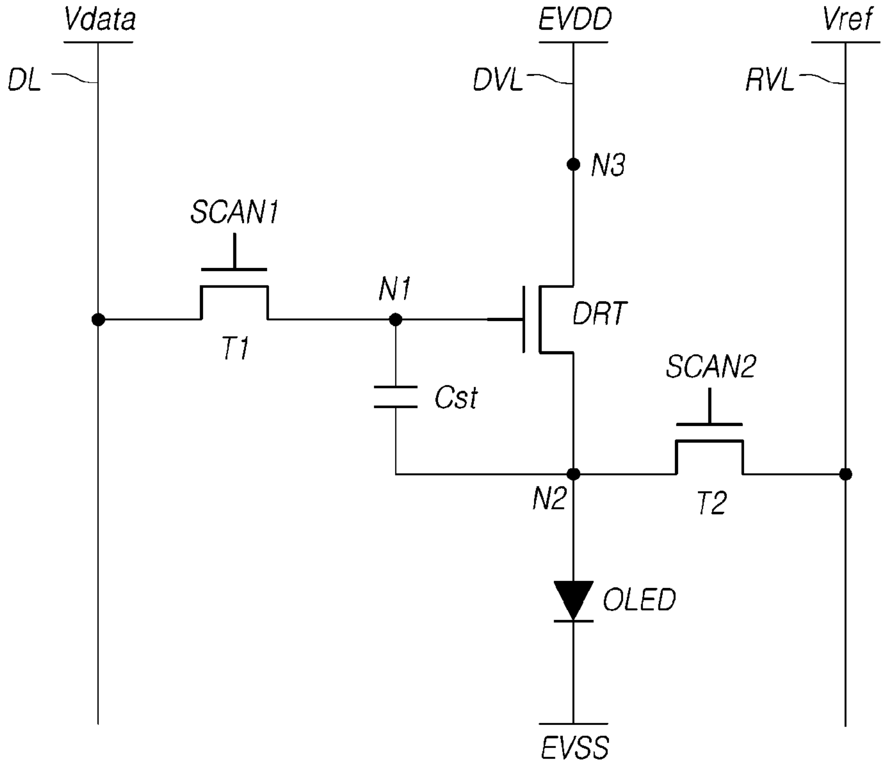
FIG. 3 is another structure of a subpixel of the display device according to an aspect of the present disclosure.

FIG. 2 illustrates the structure of a subpixel of the display device 100 according to an aspect of the present disclosure, and FIG. 3 illustrates another structure of a subpixel of the display device 100 according to an aspect of the present disclosure.

Referring to FIG. 2, in the display device 100 according to the aspect, each subpixel (SP) may include an organic light-emitting diode (OLED), a driving transistor (DRT) for driving the organic light-emitting diode (OLED), a first transistor (T1) electrically connected between a first node (N1) of the driving transistor (DRT) and a data line (DL), and a capacitor (Cst) electrically connected between the first node (N1) and a second node (N2) of the driving transistor (DRT).

The organic light-emitting diode (OLED) may include a first electrode (E1) (for example, an anode electrode or a cathode electrode), an organic emission layer (OEL), and a second electrode (E2) (for example, a cathode electrode or an anode electrode).

The first electrode (E1) of the organic light-emitting diode (OLED) may be electrically connected to the second node (N2) of the driving transistor (DRT). A ground voltage (EVSS) may be applied to the second electrode (E2) of the organic light-emitting diode (OLED).

The ground voltage (EVSS) may be a common voltage applied to all subpixels (SP).

The driving transistor (DRT) may drive the organic light-emitting diode (OLED) by supplying a driving current (Ioled) to the organic light-emitting diode (OLED).

The driving transistor (DRT) has a first node (N1), a second node (N2), and a third node (N3).

The first node (N1) of the driving transistor (DRT) is a node corresponding to a gate node, and may be electrically connected to a source node or a drain node of the first transistor (T1).

The second node (N2) of the driving transistor (DRT) may be electrically connected to the first electrode of the organic light-emitting diode (OLED), and may be a source node or a drain node.

The third node (N3) of the driving transistor (DRT) is a node to which a driving voltage (EVDD) is applied, and may be electrically connected to a driving voltage line (DVL) supplying the driving voltage (EVDD), and may be a drain node or a source node.

The driving voltage (EVDD) may be a common voltage applied to all subpixels (SP).

The first transistor (T1) may be turned on or off as the gate node receives a first scan signal (SCAN1) through the gate line.

The first transistor (T1) may be turned on by the first scan signal (SCAN1), and may transfer a data voltage (Vdata) supplied from the data line (DL) to the first node (N1) of the driving transistor (DRT).

The first transistor (T1) is also called a switching transistor.

The capacitor (Cst) may be electrically connected between the first node (N1) and the second node (N2) of the driving transistor (DRT), and may maintain the data voltage (Vdata) corresponding to an image signal voltage or a voltage corresponding thereto for an amount of time corresponding to one frame.

As described above, one subpixel (SP) illustrated in FIG. 2 may have a 2T (Transistor) 1C (Capacitor) structure including two transistors (DRT and T1) and one capacitor (Cst) in order to drive the organic light-emitting diode (OLED).

The subpixel structure (2T1C structure) illustrated in FIG. 2 is only an example for convenience of description, and one subpixel (SP) may further include one or more transistors or one or more capacitors according to functions or panel structure.

FIG. 3 illustrates an example of a 3T (Transistor) 1C (Capacitor) structure in which one subpixel (SP) further includes a second transistor (T2) electrically connected between the second node (N2) of the driving transistor (DRT) and a reference voltage line (RVL).

Referring to FIG. 3, the second transistor (T2), being electrically connected between the second node (N2) of the driving transistor (DRT) and the reference voltage line (RVL) and receiving a second scan signal (SCAN2) by the gate node, may be turned on or off.

A drain node or a source node of the second transistor (T2) may be electrically connected to the reference voltage line (RVL), and a source node or a drain node of the second transistor (T2) may be electrically connected to the second node (N2) of the driving transistor (DRT).

For example, the second transistor (T2) may be turned on in an interval during display driving, and may also be turned on in an interval during sensing driving for sensing a feature value of the driving transistor (DRT) or a feature value of the organic light-emitting diode (OLED).

The second transistor (T2) may be turned on by the second scan signal (SCAN2) according to corresponding driving timing, and may transfer a reference voltage (Vref) supplied to the reference voltage line (RVL) to the second node (N2) of the driving transistor (DRT).

Further, the second transistor (T2) may be turned on by the second scan signal (SCAN2) according to another driving timing and may transfer a voltage of the second node (N2) of the driving transistor (DRT) to the reference voltage line (RVL).

In this case, a sensing unit (for example, an analog-to-digital converter), which can be electrically connected to the reference voltage line (RVL), may measure the voltage of the second node (N2) of the driving transistor (DRT) through the reference voltage line (RVL).

In other words, the second transistor (T2) may control the voltage state of the second node (N2) of the driving transistor (DRT) or transfer the voltage of the second node (N2) of the driving transistor (DRT) to the reference voltage line (RVL).

Meanwhile, the capacitor (Cst) may be an intentionally designed external capacitor outside the driving transistor (DRT) rather than a parasitic capacitor (for example, Cgs or Cgd) corresponding to an internal capacitor existing between the first node (N1) and the second node (N2) of the driving transistor (DRT).

Each of the driving transistor (DRT), the first transistor (T1), and the second transistor (T2) may be an n-type transistor or a p-type transistor.

Meanwhile, the first scan signal (SCAN1) and the second scan signal (SCAN2) may be separate gate signals. In this case, the first scan signal (SCAN1) and the second scan signal (SCAN2) may be applied to the gate node of the first transistor (T1) and the gate node of the second transistor (T2), respectively, through different gate lines.

According to the circumstances, the first scan signal (SCAN1) and the second scan signal (SCAN2) may be the same gate signal. In this case, the first scan signal (SCAN1) and the second scan signal (SCAN2) may be applied in common to the gate node of the first transistor (T1) and the gate node of the second transistor (T2) through the same gate line.

Each subpixel structure illustrated in FIGS. 2 and 3 is only an example for description, and may further include one or more transistors, or one or more capacitors depending on the circumstances.

Alternatively, each of a plurality of subpixels may have the same structure, or some of the plurality of subpixels may have different structures.

Figure 4:
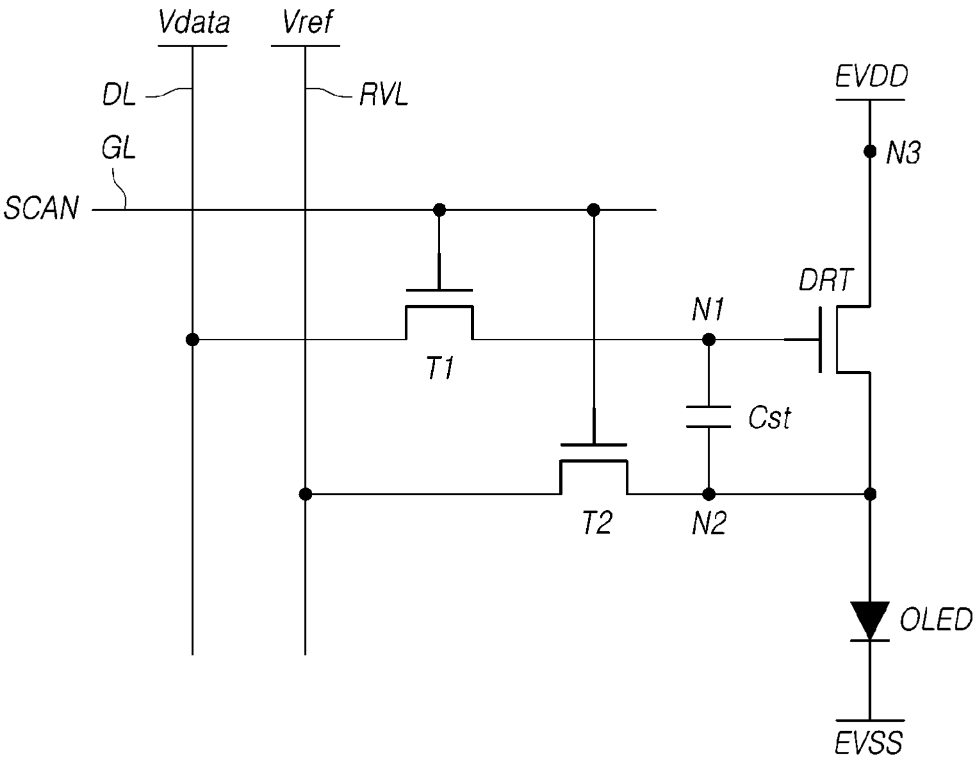
FIG. 4 is a still another structure of a subpixel of the display device according to an aspect of the present disclosure.

FIG. 4 illustrates still another structure of a subpixel of the display device 100 according to the aspect.

The subpixel structure of FIG. 4 is a variation from the 3T1C structure of FIG. 3.

In the case of the subpixel structure of FIG. 4, the gate node of the first transistor (T1) and the gate node of the second transistor (T2) are connected to the same gate line (GL) and equally receive a scan signal (SCAN).

Figure 5:
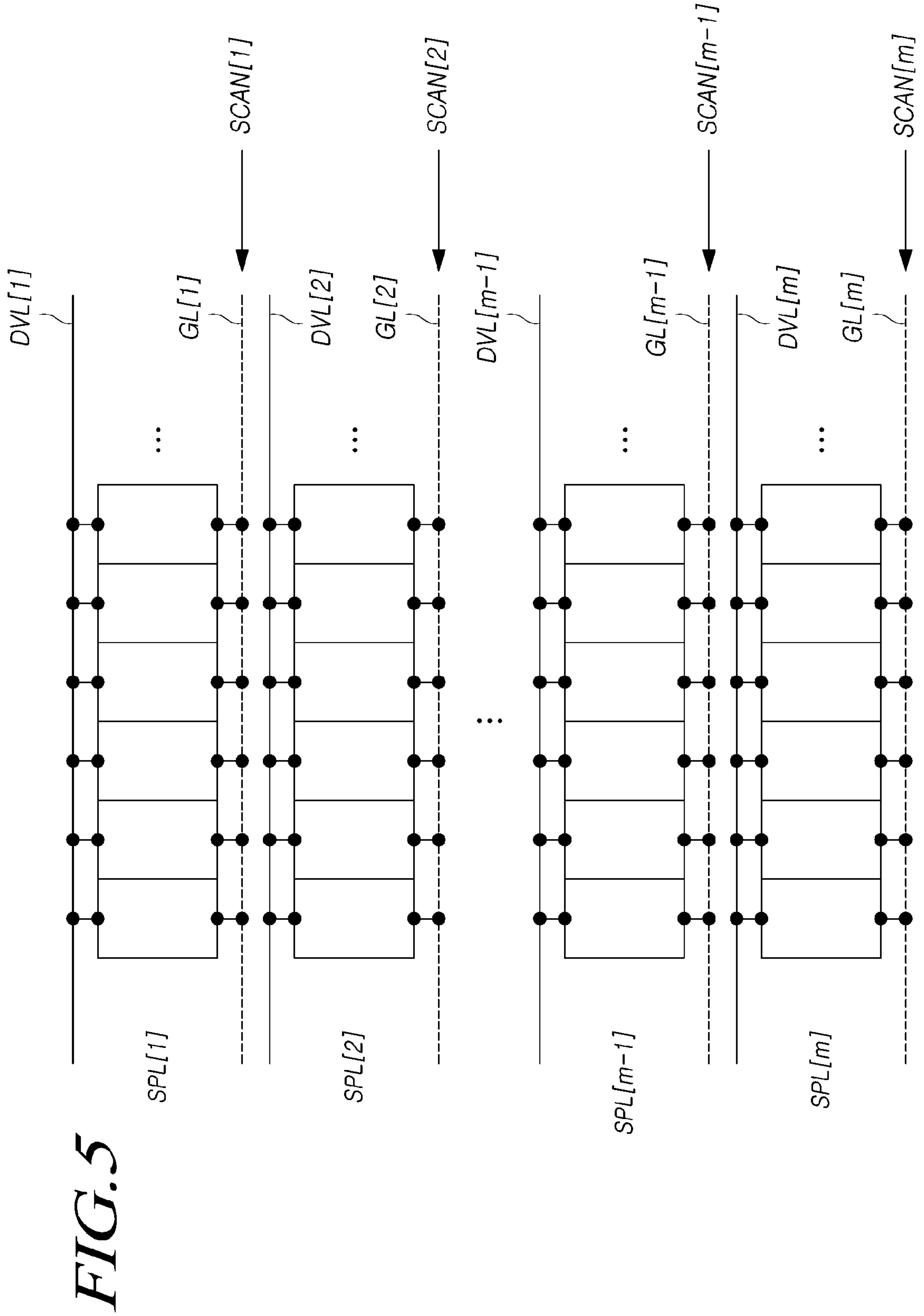
FIG. 5 is a diagram illustrating the arrangement of driving voltage lines in a display device according to an aspect of the present disclosure.
Figure 6:
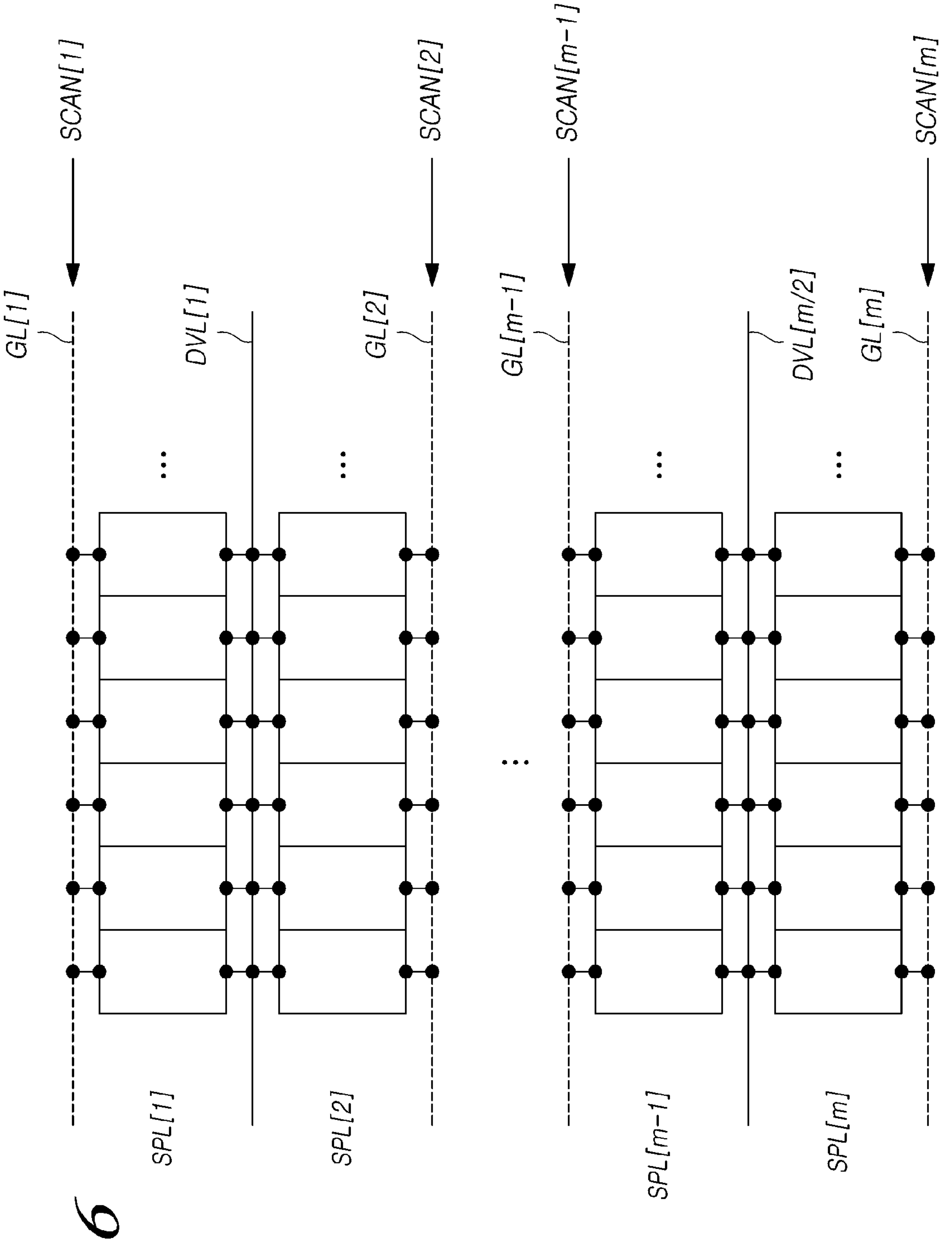
FIG. 6 is another diagram illustrating the arrangement of driving voltage lines in the display device according to an aspect of the present disclosure.

FIG. 5 is a diagram illustrating an array of driving voltage lines (DVL) in the display device 100 according to the aspect. FIG. 6 is a diagram illustrating another array of driving voltage lines (DVL) in the display device 100 according to the aspect.

Referring to FIGS. 5 and 6, a plurality of subpixels (SP) is arranged in a matrix form in a pixel array area (PXL).

Accordingly, m (m being a natural number larger than or equal to 2) subpixel lines (SPL[1] to SPL[m]) exist in the pixel array area (PXL).

Each of the m subpixel lines (SPL[1] to SPL[m]) may be a group of subpixels (SP) arranged on the same row or a group of subpixels (SP) arranged on the same column.

When the structure of each subpixel is the same as that illustrated in FIG. 4, m gate lines (GL[1] to GL[m]) are arranged on the m subpixel lines (SPL[1] to SPL[m]).

The m gate lines (GL[1] to GL[m]) transfer m scan signals (SCAN[1] to SCAN[m]) to m subpixel lines (SPL[1] to SPL[m]).

Meanwhile, in order to supply the driving voltage (EVDD) to the third node (N3), corresponding to the drain node or the source node of the driving transistor (DRT) within each subpixel, a plurality of driving voltage lines may be arranged in the pixel array area including the pixel array (PXL).

For example, the plurality of driving voltage lines may be arranged parallel to the gate lines.

Each of the plurality of driving voltage lines may be arranged to correspond to one subpixel line. Referring to the example of FIG. 5, one driving voltage line (for example, DVL[1]) may be arranged to correspond to one subpixel line (for example, SPL[1]). That is, m driving voltage lines (DVL[1] to DVL[m]) may be arranged to correspond to the m subpixel lines (SPL[1] to SPL[m]) in one-to-one correspondence.

As described above, according to the structure in which one driving voltage line is arranged per subpixel line, the m driving voltage lines (DVL[1] to DVL[m]) may be individually controlled.

Each of the plurality of driving voltage lines may be arranged to correspond to two or more subpixel lines. Referring to the example of FIG. 6, one driving voltage line (for example, DVL[1]) may be arranged to correspond to two subpixel lines (for example, SPL[1] and SPL[1]). That is, m/2 driving voltage lines (DVL[1] to DVL[m/2]) (m being a multiple of 2) may be arranged to correspond to the m subpixel lines (SPL[1] to SPL[m]) in one-to-one correspondence.

As described above, according to the structure in which one driving voltage line is arranged per two or more subpixel lines, the m driving voltage lines (DVL[1] to DVL[m]) may be grouped and efficiently controlled, and an opening rate of the pixel array (PXL) may increase.

Meanwhile, when only one driving voltage line exists in the pixel array area, that is, in the structure in which one driving voltage line corresponds to all subpixel lines, the display device 100 according to the aspect operates in a global shutter-driving scheme to be described below.

Hereinafter, the case in which the m driving voltage lines (DVL[1] to DVL[m]) correspond to the m subpixel lines (SPL[1] to SPL[m]) in one-to-one correspondence as illustrated in FIG. 5 will be described as an example.

Figure 7:
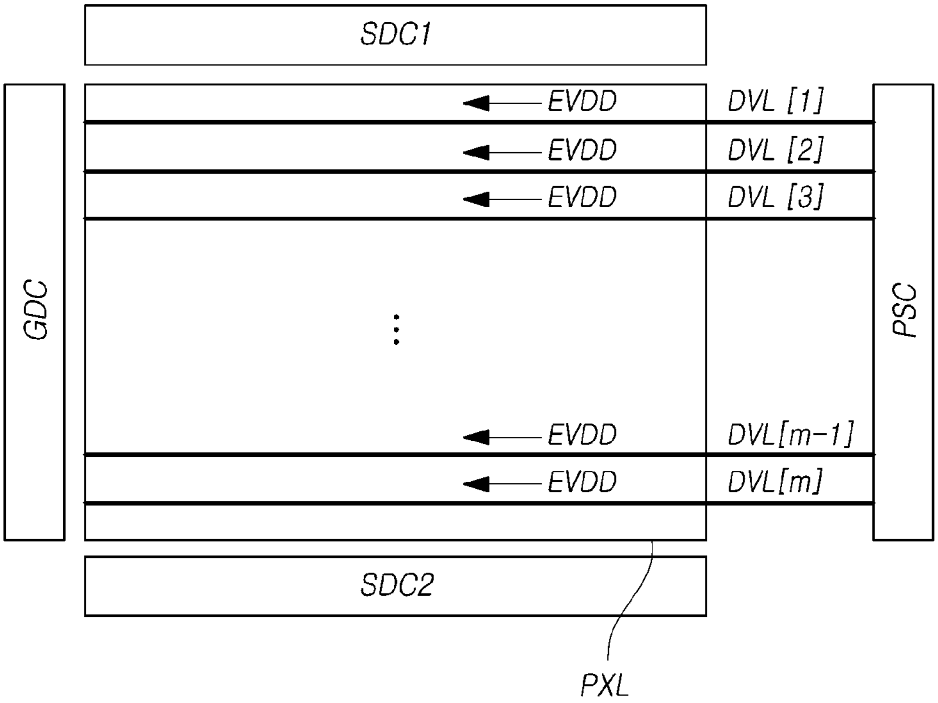
FIG. 7 illustrates that a driving voltage corresponding to a DC voltage is applied in common to a plurality of driving voltage lines by a power supply circuit in the display device according to an aspect of the present disclosure.
Figure 8:
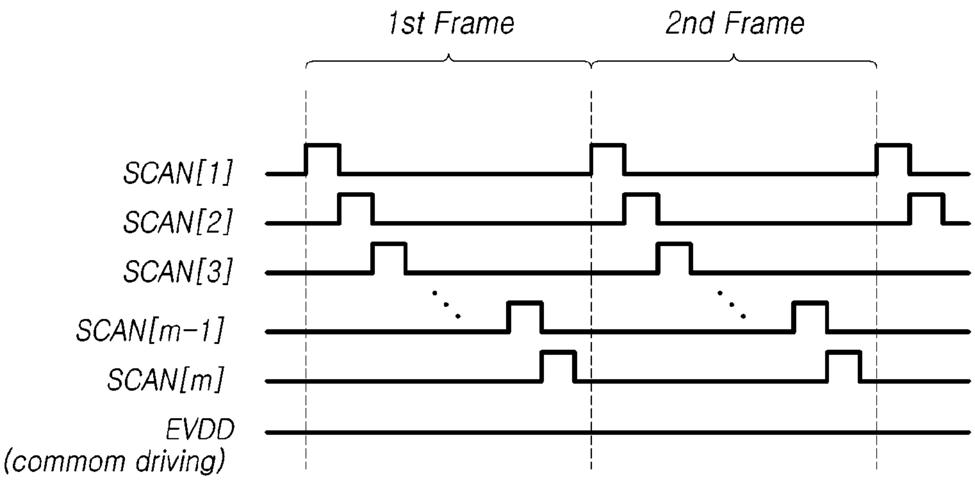
FIG. 8 is a driving timing diagram when a driving voltage corresponding to a DC voltage is applied in common to a plurality of driving voltage lines in the display device according to an aspect of the present disclosure.
Figure 9:
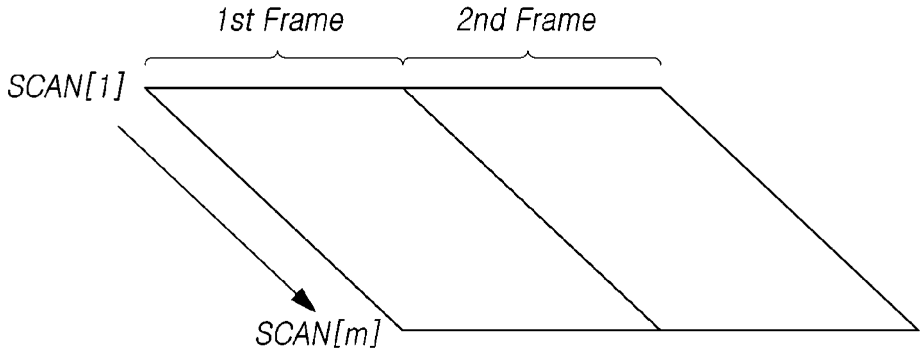
FIG. 9 illustrates a first frame and a second frame when a driving voltage corresponding to a DC voltage is applied in common to a plurality of driving voltage lines in the display device according to an aspect of the present disclosure.

FIGS. 7 to 9 illustrate a common driving scheme in which the driving voltage (EVDD) corresponding to a DC voltage is applied to the plurality of m driving voltage lines (DVL[1] to DVL[m]) in common by a power supply circuit (PSC), a driving timing diagram according to the common driving scheme, and first and second frames in the display device 100 according to the aspect.

Referring to FIGS. 7 to 9, when a display is driven, the m subpixel lines (SPL[1] to SPL[m]) are sequentially driven.

To this end, the gate-driving circuit (GDC) sequentially supplies m scan signals (SCAN[1] to SCAN[m]) to m gate lines (GL[1] to GL[m]).

Accordingly, the first and second transistors (T1 and T2) within each subpixel on the m subpixel lines (SPL[1] to SPL[m]) sequentially receive the m scan signals (SCAN[1] to SCAN[m]).

Referring to FIGS. 7 to 9, in the display device 100 according to the aspects, the power supply circuit (PSC) may supply the driving voltage (EVDD) corresponding to the DC voltage to the plurality of driving voltage lines (DVL[1] to DVL[m]) arranged in the pixel array area.

Through the plurality of driving voltage lines (DVL[1] to DVL[m]) arranged in the pixel array area, the driving voltage (EVDD) corresponding to the DC voltage may be transferred to the third node (N3) corresponding to the drain node or the source node of the driving transistor (DRT) within each subpixel in the pixel array area in common.

Meanwhile, all or some parts of the previous frame screen appear on the current frame screen. For example, when an object moving at a high speed in an image is expressed, the object may appear distorted. Such a phenomenon is called "motion blur".

In order to remove the motion blur, it is required to increase a frame rate and decrease image persistence.

However, due to various constraints on an interface speed, an operation speed of a controller (CONT), and an operation speed of the source-driving circuit (SDC), there is a limit on increasing the frame rate or decreasing image persistence. Accordingly, a limit on reducing or removing the motion blur also exists. In this specification, a high frame rate has the same meaning as low image persistence and a rapid response rate.

Meanwhile, if the frame rate increases or image persistence decreases in order to solve the motion blur, the operation speed of the driving circuits (for example, the interface, the controller (CONT), and the source-driving circuit (SDC)) may increase, current consumption of the integrated circuit (IC) implementing the driving circuits may increase, a circuit area may increase, and circuit costs may increase.

Accordingly, the present aspects provide a driving method of reducing or removing motion blur by enabling display driving having a high frame rate, a rapid response speed, and low image persistence while using driving circuits (for example, the interface, the controller (CONT), and the source-driving circuit (SDC)) having reasonable performance and costs and a small circuit area.

Hereinafter, a driving method of effectively preventing motion blur will be described. However, hereinafter, the case in which the m driving voltage lines (DVL[1] to DVL[m]) correspond to the m subpixel lines (SPL[1] to SPL[m]) in one-to-one correspondence as illustrated in FIG. 5 will be described as an example.

The driving method of preventing the motion blur to be described below is a driving method of individually driving the plurality of driving voltage lines (DVL[1] to DVL[m]) and applying toggled driving voltages (EVDD[1] to EVDD[m]) to the plurality of driving voltage lines (DVL[1] to DVL[m]), and is also called a "driving method of individually toggling driving voltages".

Figure 10:
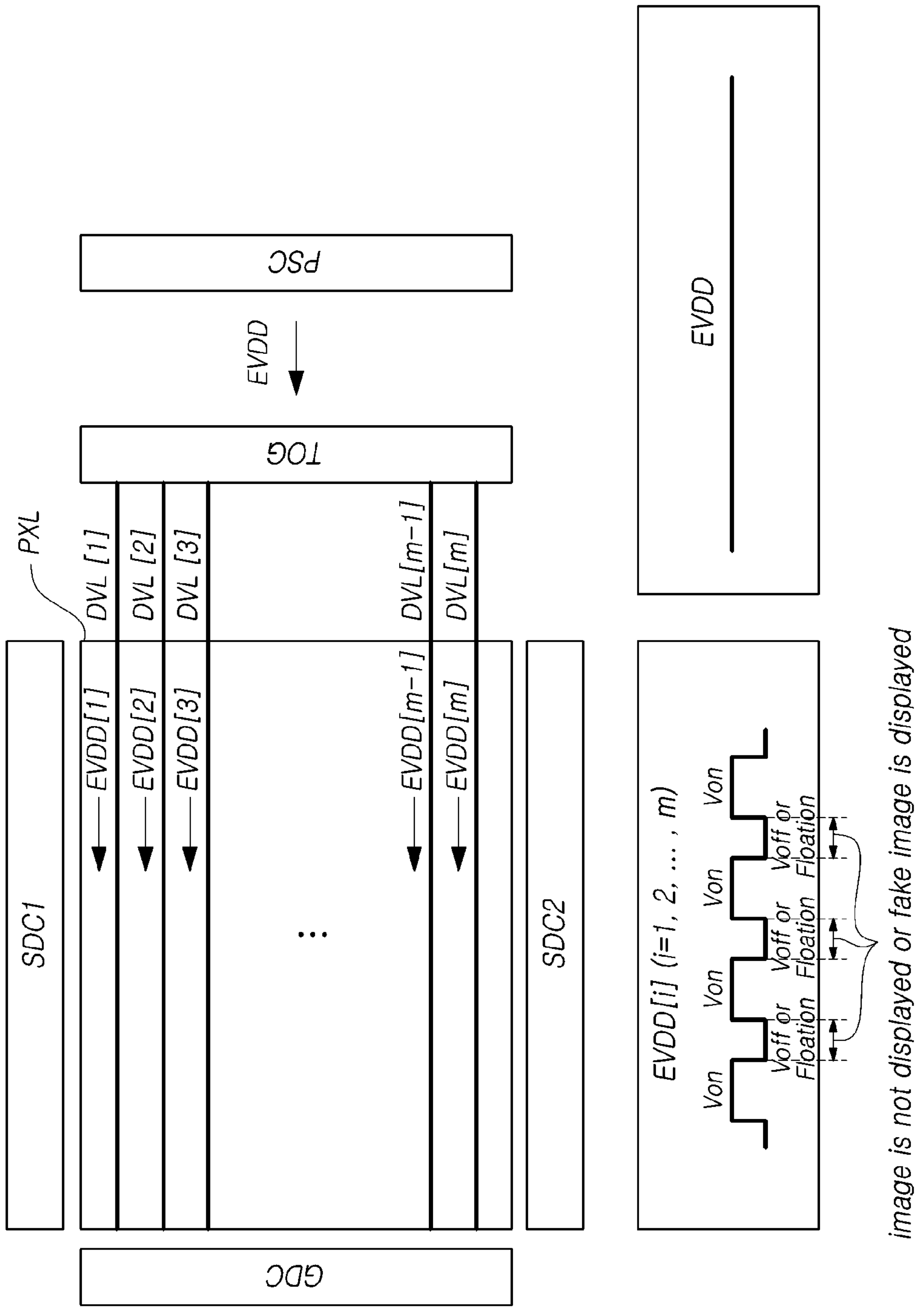
FIG. 10 illustrates that toggled driving voltages are individually applied to each of a plurality of driving voltage lines by a toggling circuit in the display device according to an aspect of the present disclosure.

FIG. 10 illustrates that toggled driving voltages (EVDD[1] to EVDD[m]) are individually applied to each of the plurality of driving voltage lines (DVL[1] to DVL[m]) by a toggling circuit (TOG) in the display device 100 according to the aspect.

Referring to FIG. 10, m (m being a natural number larger than or equal to 2) driving voltage lines (DVL[1] to DVL[m]) for transferring individual driving voltages (EVDD[1] to EVDD[m]) to a plurality of subpixels (SP) may be arranged in the pixel array area including the pixel array (PXL).

The m driving voltage lines (DVL[1] to DVL[m]) may correspond to the m subpixel lines (SPL[1] to SPL[m]) in one-to-one correspondence.

The driving voltages (EVDD[1] to EVDD[m]) individually applied to each of the m driving voltage lines (DVL[1] to DVL[m]) are toggled.

Accordingly, in each of the plurality of subpixels (SP), the toggled driving voltages (EVDD[1] to EVDD[m]) may be applied to the third node (N3) corresponding to the drain node or the source node of the driving transistor (DRT).

The toggled driving voltages (EVDD[1] to EVDD[m]) may repeatedly switch between a first state corresponding to an on-voltage (Von) state and a second state corresponding to an off-voltage (Voff) or floating state.

The on-voltage (Von) corresponding to the first state in the toggled driving voltages (EVDD[1] to EVDD[m]) may be the same as the driving voltage (EVDD) corresponding to the DC voltage.

The driving voltage (EVDD) may be toggled by repeating input and non-input of the driving voltage (EVDD) corresponding to the DC voltage to the m driving voltage lines (DVL[1] to DVL[m]).

As described above, by individually and independently driving the m driving voltage lines (DVL[1] to DVL[m]), the m subpixel lines (SPL[1] to SPL[m]) may be by individually and independently driven.

Further, since states of the driving voltages (EVDD[1] to EVDD[m]) individually applied to each of the m driving voltage lines (DVL[1] to DVL[m]) are toggled to the first state (Von) and the second state (Voff or floating), states of the m subpixel lines (SPL[1] to SPL[m]) may be toggled to the on-state and the off-state.

Meanwhile, during at least one frame period, through the m driving voltage lines (DVL[1] to DVL[m]), the subpixels, to which the toggled driving voltages (EVDD[1] to EVDD [m]) are supplied, may be toggled from the on-state to the off-state or from the off-state to the on-state.

The “on-state” of the subpixel may mean that the subpixel emits light or that the subpixel is driven. The “off-state” of the subpixel may mean that the subpixel does not emit light or the subpixel is not driven.

Accordingly, referring to FIG. 10, the corresponding subpixels may be in the “off-state” during a period during which the toggled driving voltages (EVDD[1] to EVDD[m]) within at least one frame period are in the second state (Voff or floating).

Therefore, an image may not be displayed, or a fake image different from the image may be displayed for a predetermined period of at least one frame period.

A predetermined period during which the image is not displayed or during which the fake image different from the image is displayed may be a period during which toggling timing of the driving voltage (EVDD) is synchronized.

That is, the predetermined period during which the image is not displayed or during which the fake image different from the image is displayed may be a period during which the toggled driving voltages (EVDD[1] to EVDD[m]) are in the second state (Voff or floating).

An area in which the image is not displayed or in which the fake image different from the image is displayed during the predetermined period of at least one frame period may be shown as a black image or an image having brightness similar to black.

As described above, as the image is not displayed or the fake image different from the image is displayed during the predetermined period of at least one frame period, the user recognizes a frame rate higher than the actual frame rate. Accordingly, the motion blur can be reduced or removed.

Figure 11:
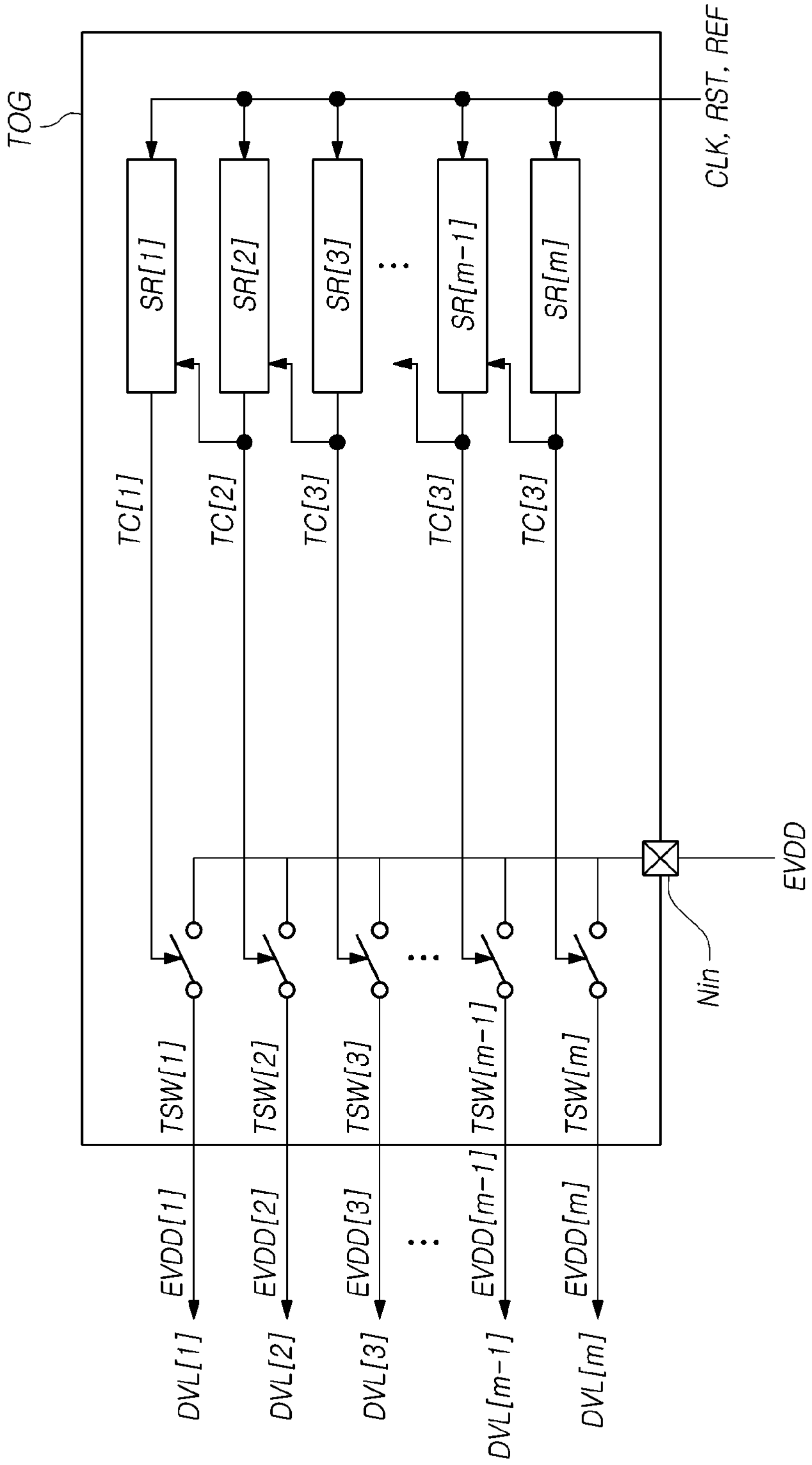
FIG. 11 illustrates a toggling circuit of the display device according to an aspect of the present disclosure.

FIG. 11 illustrates a toggling circuit (TOG) of the display device 100 according to the aspect.

Referring to FIG. 11, the display device 100 according to the aspect may include a toggling circuit (TOG) for individually or independently driving m driving voltage lines (DVL[1] to DVL[m]).

The toggling circuit (TOG) is a circuit for toggling of the driving voltage (EVDD).

The toggling circuit (TOG) may toggle the driving voltage (EVDD) corresponding to the DC voltage and output toggled driving voltages (EVDD[1] to EVDD[m]) to the m driving voltage lines (DVL[1] to DVL[m]).

Referring to FIG. 11, the toggling circuit (TOG) may include an input terminal (Nin) to which the driving voltage (EVDD) having a predetermined voltage value (for example, Von) is input, a plurality of toggle switches (TSW [1] to TSW[m]) connected to correspond to the plurality of driving voltage lines (DVL[1] to DVL[m]), and a plurality of shift registers (SR[1] to SR[m]) for outputting a plurality of toggle control signals (TC[1] to TC[m]) controlling on/off operation of the plurality of toggle switches (TSW[1] to TSW[m]).

Each of the plurality of toggle switches (TSW[1] to TSW[m]) may toggle the driving voltage (EVDD), which is turned on/off according to the corresponding toggle control signal (one of TC[1] to TC[m]) and input to the input terminal (Nin), and may output the toggled driving voltage (one of EVDD[1] to EVDD[m]) to the corresponding driving voltage line (one of DVL[1] to DVL[m]).

Through the toggling circuit (TOG), the driving voltage (EVDD) may be toggled for each of the plurality of driving voltage lines (DVL[1] to DVL[m]) and driving control for preventing the motion blur may be performed using the toggled driving voltage (one of EVDD[1] to EVDD[m]).

Referring to FIG. 11, a plurality of shift registers SR[1] to SR[m]) may generate and output a plurality of toggle control signals (TC[1] to TC[m]) based on a reference signal (REF), which is a reference of the plurality of toggle control signals (TC[1] to TC[m]) or the first toggle control signal (TC[1]), a reset signal (RST) indicating an end or beginning of a toggle control period, and a clock signal (CLK) for signal timing.

Based on the three control signals (CLK, RST, and REF), the plurality of toggle control signals (TC[1] to TC[m]) may be generated in a desired form.

Meanwhile, the toggling circuit (TOG) illustrated in FIG. 11 may be arranged within the pixel array area.

Alternatively, the toggling circuit (TOG) may be arranged in an outer area of the pixel array area.

In this case, in the pixel array area, the size of an area for displaying an image may be maximized and the size of an area, which is not directly related to the image display, may be reduced.

Meanwhile, as described above, in order to prevent the motion blur, image driving may be performed through the driving method (the driving method of individually toggling driving voltages) of individually driving the plurality of driving voltage lines (DVL[1] to DVL[m]) and applying the toggled driving voltages (EVDD[1] to EVDD[m]) to the plurality of driving voltage lines (DVL[1] to DVL[m]) in the present aspects.

Here, the image-driving method may include a rolling shutter-driving method of sequentially emitting the m subpixel lines (SPL[1] to SPL[m]) and a global shutter-driving method of simultaneously emitting the m subpixel lines (SPL[1] to SPL[m]).

Hereinafter, the driving method of individually toggling driving voltages under the rolling shutter-driving method and the method of individually toggling driving voltages under the global shutter-driving method will be sequentially described.

Figure 12:
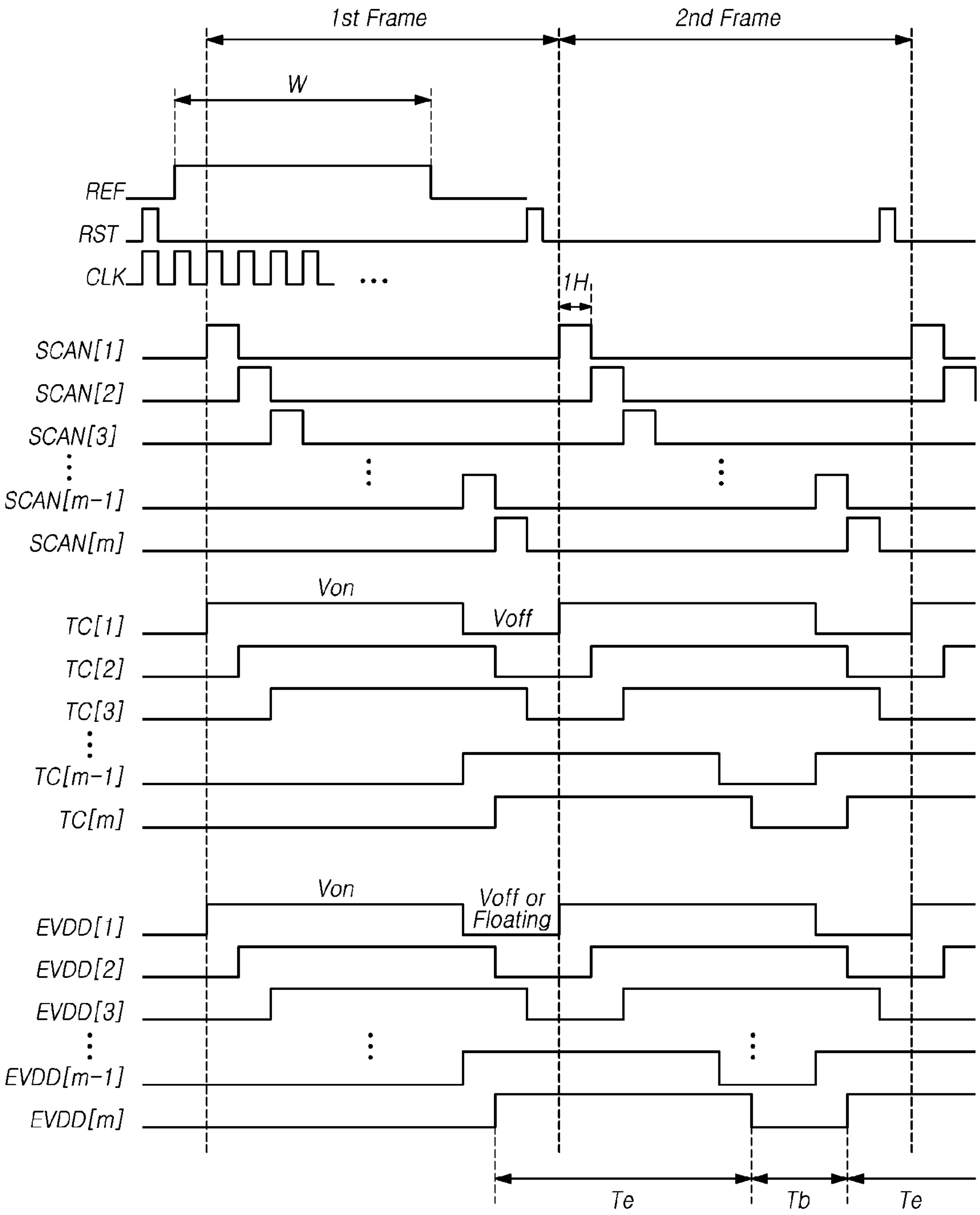
FIG. 12 is a driving timing diagram according to a rolling shutter-driving method when toggled driving voltages are individually applied to each of a plurality of driving voltage lines in the display device according to an aspect of the present disclosure.
Figure 13:
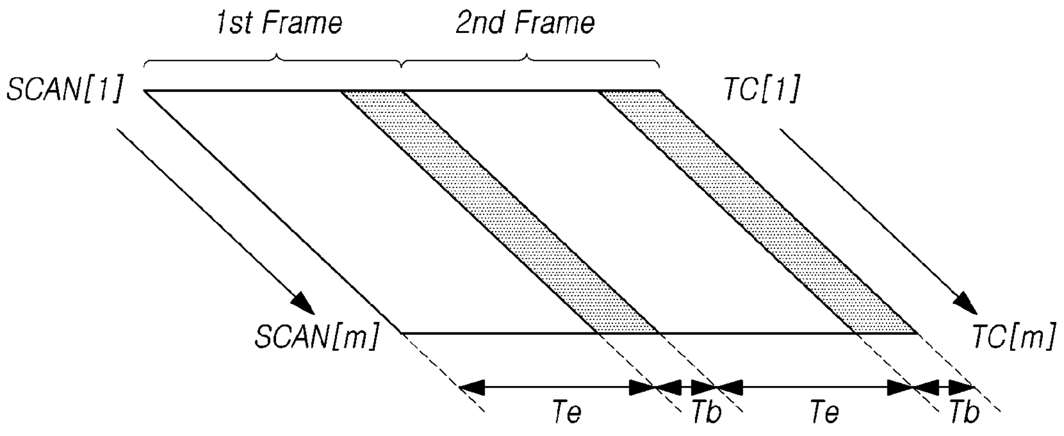
FIG. 13 illustrates a first frame and a second frame according to a rolling shutter-driving method when toggled driving voltages are individually applied to each of a plurality of driving voltage lines in the display device according to an aspect of the present disclosure.

FIGS. 12 to 13 illustrate a driving timing diagram according to the rolling shutter-driving method, and first and second frames when toggled driving voltages (EVDD[1] to EVDD[m]) are individually applied to each of m driving voltage lines (DVL[1] to DVL[m]) in the display device 100 according to the aspects.

The reference signal (REF), which is a reference of the plurality of toggle control signals (TC[1] to TC[m]) or the first toggle control signal (TC[1]) has a low level (or a high level) and a high level (or a low level).

The length (W) of a high-level period (or a low-level period) of the reference signal (REF) corresponds to the length of an on-voltage (Von) state period for each of the plurality of toggle control signals (TC[1] to TC[m]).

The reset signal (RST) may indicate an end or a beginning of a toggle control period (for example, one frame).

Further, the clock signal (CLK) may guide rising and falling timing of the scan signals (SCAN[1] to SCAN[m]) and toggle control signals (TC[1] to TC[m]).

During a first frame period, m scan signals (SCAN[1] to SCAN[m]) may be sequentially supplied to m gate lines (GL[1] to GL[m]) corresponding to m subpixel lines (SPL

[1] to SPL[m]). Here, the m scan signals (SCAN[1] to SCAN[m]) have a high level interval (or a low level interval) of a 1H length.

Further, for the driving method of individually toggling driving voltages under the rolling shutter-driving method, m toggle control signals (TC[1] to TC[m]) sequentially rise from the off-voltage (Voff) to the on-voltage (Von) with a time difference of 1H.

In addition, each of the m toggle control signals (TC[1] to TC[m]) maintains the on-voltage (Von) during the length (W) of the high level of the reference signal (REF) and then switches to the off-voltage (Voff).

The m driving voltages (EVDD[1] to EVDD[m]) applied to the respective m driving voltage lines (DVL[1] to DVL [m]) are toggled by being synchronized with toggling timing of the m toggle control signals (TC[1] to TC[m]).

The m toggled driving voltages (EVDD[1] to EVDD[m]) sequentially switch from the off-voltage (Voff) or floating state to the on-voltage (Von) state with a time difference of 1 H.

Further, each of the toggled m driving voltages (EVDD[1] to EVDD[m]) maintains the on-voltage (Von) during the length (W) of the high level of the reference signal (REF) and then switches to the off-voltage (Voff) or floating state.

Like during the first frame period described above, during a second frame period, the m scan signals (SCAN[1] to SCAN[m]) are sequentially supplied to m gate lines (GL[1] to GL[m]) and the m toggle control signals (TC[1] to TC[m]) and the m driving voltages (EVDD[1] to EVDD[m]) corresponding to the m driving voltage lines (DVL[1] to DVL[m]) are sequentially toggled.

In other words, when the driving method of individually toggling driving voltages under the rolling shutter-driving method is applied, the toggled driving voltages (EVDD[1] to EVDD[m]) applied to the plurality of driving voltage lines (DVL[1] to DVL[m]) may have different toggle timings (that is, state change timings).

That is, the toggled driving voltages (EVDD[1] to EVDD [m]) applied to the plurality of driving voltage lines (DVL [1] to DVL[m]) may be sequentially toggled from the on-voltage (Von) to the off-voltage (Voff) or floating state within one frame period.

Further, the toggled driving voltages (EVDD[1] to EVDD [m]) applied to the plurality of driving voltage lines (DVL [1] to DVL[m]) may be sequentially toggled from the off-voltage (Voff) or floating state to the on-voltage (Von) within one frame period.

According to the above description, motion blur can be prevented in the display device 100 driven based on the rolling shutter-driving method, by which the m subpixel lines (SPL[1] to SPL[m]) sequentially emit light.

Referring to FIGS. 12 and 13, the beginning time of a predetermined period (Tb), which is a period during which the m driving voltages (EVDD[1] to EVDD[m]) toggled for respective m subpixel lines (SPL[1] to SPL[m]) corresponding to the m driving voltage lines (DVL[1] to DVL[m]) maintain the off-voltage (Voff) or floating state, may be shifted (shift size=1H).

The predetermined period (Tb) mentioned above is a period during which the m toggled driving voltages (EVDD [1] to EVDD[m]) maintain the off-voltage (Voff) or floating state, and may mean a non-emission period during which the m subpixel lines (SPL[1] to SPL[m]) receiving the m toggled driving voltages (EVDD[1] to EVDD[m]) do not emit light.

The beginning time of the predetermined period (Tb) is a time at which the on-voltage (Von) state switches to the off-voltage (Voff) or floating state.

A period (Te) during which the m toggled driving voltages (EVDD[1] to EVDD[m]) are in the on-voltage (Von) state is an emission period during which the m subpixel lines (SPL[1] to SPL[m]) can sequentially emit light.

The length of the emission period (Te) corresponds to the length of the on-voltage state period of each of the m toggled driving voltages (EVDD[1] to EVDD[m]), corresponds to the length of the on-voltage (Von) state period of each of the m toggled control signals (TC[1] to TC[m]), and corresponds to the length (W) of the high-level period of the reference signal (REF).

The period (Tb) during which the m toggled driving voltages (EVDD[1] to EVDD[m]) are in the off-voltage (Voff) or floating state is a non-emission period during which the m subpixel lines (SPL[1] to SPL[m]) do not sequentially emit light.

On the m subpixel lines (SPL[1] to SPL[m]) corresponding to the m driving voltage lines (DVL[1] to DVL[m]), an image may not be sequentially displayed, or a fake image different from the image may be sequentially displayed during the predetermined period (Tb) (non-emission period).

As described above, when the individual driving voltage toggling control is performed under the rolling shutter-driving method, the user may recognize the non-emission period (Tb) as separate frames and thus consider the actual two frames (the first frame and the second frame) as a total of four frames (two Te and two Tb). Accordingly, from the aspect of user recognition, it is possible to implement a higher frame rate and lower image persistence. Therefore, motion blur can be reduced or prevented.

Figure 14:
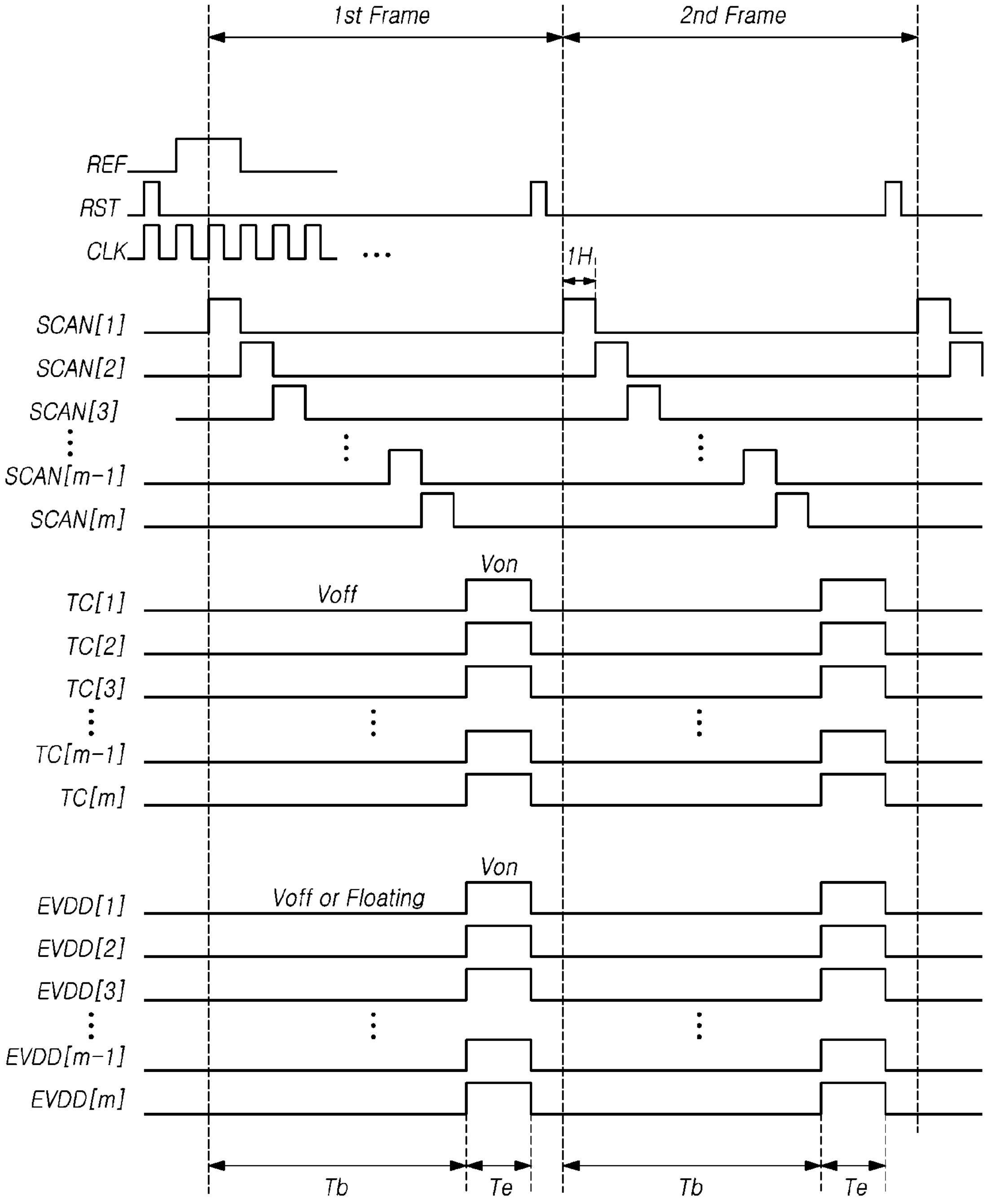
FIG. 14 is a driving timing diagram according to a global shutter-driving method when toggled driving voltages are individually applied to each of a plurality of driving voltage lines in the display device according to an aspect of the present disclosure.

FIG. 14 illustrates a driving timing diagram according to the global shutter-driving method, and first and second frames when toggled driving voltages (EVDD[1] to EVDD [m]) are individually applied to each of a plurality of driving voltage lines (DVL[1] to DVL[m]) in the display device 100 according to the aspects.

For the driving method of individually toggling driving voltages under the global shutter-driving method, m toggle control signals (TC[1] to TC[m]) simultaneously rise from the off-voltage (Voff) to the on-voltage (Von).

In addition, the m toggle control signals (TC[1] to TC[m]) maintain the on-voltage (Von) during the same period (Te) by the length (W) of the high-level period of the reference signal (REF), and then simultaneously switch to the off-voltage (Voff).

The m driving voltages (EVDD[1] to EVDD[m]) applied to the respective m driving voltage lines (DVL[1] to DVL [m]) are toggled by being synchronized with toggling timing of the m toggle control signals (TC[1] to TC[m]).

The m toggled driving voltages (EVDD[1] to EVDD[m]) simultaneously switch from the off-voltage (Voff) or floating state to the on-voltage (Von) state.

Further, the m toggled driving voltages (EVDD[1] to EVDD[m]) maintain the on-voltage (Von) state during the length (W) of the high-level period of the reference signal (REF) and then simultaneously switch to the off-voltage (Voff) or floating state.

Like during the first frame period described above, during a second frame period, the m scan signals (SCAN[1] to SCAN[m]) are sequentially supplied to m gate lines (GL[1] to GL[m]) and the m toggle control signals (TC[1] to TC[m]) and the m driving voltages (EVDD[1] to EVDD[m]) corresponding to the m driving voltage lines (DVL[1] to DVL[m]) are simultaneously toggled.

In other words, when the driving method of individually toggling driving voltages under the rolling shutter-driving method is applied, the toggled driving voltages (EVDD[1] to EVDD[m]) applied to the plurality of driving voltage lines (DVL[1] to DVL[m]) may have different toggle timings (that is, state change timings).

That is, the toggled driving voltages (EVDD[1] to EVDD [m]) applied to the plurality of driving voltage lines (DVL [1] to DVL[m]) may be simultaneously toggled from the off-voltage (Voff) or floating state to the on-voltage (Von) state within one frame period.

Further, the toggled driving voltages (EVDD[1] to EVDD [m]) applied to the plurality of driving voltage lines (DVL [1] to DVL[m]) may be simultaneously toggled from the on-voltage (Von) state to the off-voltage (Voff) or floating state within one frame period.

That is, toggling timing of the toggled driving voltages (EVDD[1] to EVDD[m]) applied to the m driving voltage lines (DVL[1] to DVL[m]) may be the same.

The toggled driving voltages (EVDD[1] to EVDD[m]) applied to the plurality of driving voltage lines (DVL[1] to DVL[m]) may be simultaneously toggled from the off-voltage (Voff) or floating state to the on-voltage (Von) state within one frame period.

According to the above description, motion blur can be prevented in the display device 100 driven based on the global shutter-driving method by which the m subpixel lines (SPL[1] to SPL[m]) simultaneously emit light.

Figure 15:
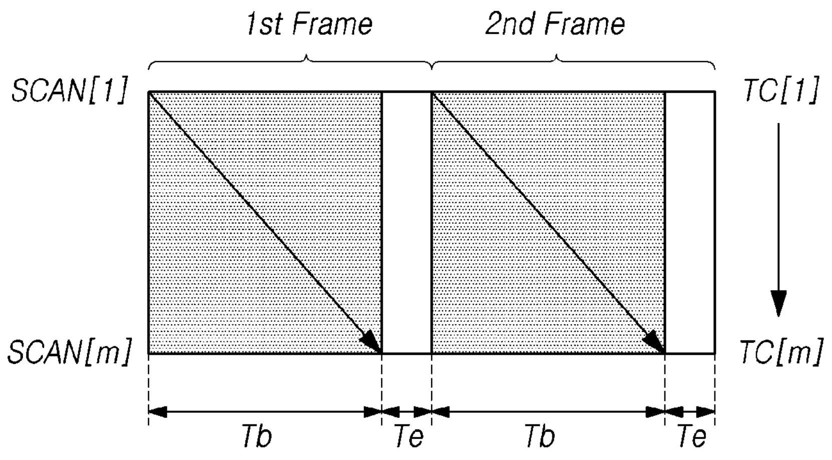
FIG. 15 illustrates a first frame and a second frame according to a global shutter-driving method when toggled driving voltages are individually applied to each of a plurality of driving voltage lines in the display device according to an aspect of the present disclosure.

Referring to FIGS. 14 and 15, the beginning time of the predetermined period (Tb), which is a period during which the m driving voltages (EVDD[1] to EVDD[m]) toggled for respective m subpixel lines (SPL[1] to SPL[m]) corresponding to the m driving voltage lines (DVL[1] to DVL[m]) maintain the off-voltage (Voff) or floating state, may be the same.

The predetermined period (Tb) mentioned above is a period during which the m toggled driving voltages (EVDD [1] to EVDD[m]) maintain the off-voltage (Voff) or floating state, and may mean a non-emission period during which the m subpixel lines (SPL[1] to SPL[m]) receiving the m toggled driving voltages (EVDD[1] to EVDD[m]) do not emit light.

The beginning time of the predetermined period (Tb) is a time at which the on-voltage (Von) state switches to the off-voltage (Voff) or floating state.

The period (Te) during which the m toggled driving voltages (EVDD[1] to EVDD[m]) are in the on-voltage (Von) state corresponds to an emission period during which the m subpixel lines (SPL[1] to SPL[m]) can simultaneously emit light.

The length of the emission period (Te) corresponds to a length of the on-voltage (Von) state period of each of the m toggled driving voltages (EVDD[1] to EVDD[m]), corresponds to the length of the on-voltage (Von) state period of each of the m toggled control signals (TC[1] to TC[m]), and corresponds to the length (W) of the high-level period of the reference signal (REF).

The period (Tb) during which the m toggled driving voltages (EVDD[1] to EVDD[m]) are in the off-voltage (Voff) or floating state is a non-emission period during which the m subpixel lines (SPL[1] to SPL[m]) do not simultaneously emit light.

On the m subpixel lines (SPL[1] to SPL[m]) corresponding to the m driving voltage lines (DVL[1] to DVL[m]), an image may not be simultaneously displayed, or a fake image different from the image may be simultaneously displayed during the predetermined period (Tb) (non-emission period).

As described above, when the individual driving voltage toggling control is performed under the global shutter-driving method, the user may recognize the non-emission period (Tb) as separate frames and thus perceive a total of four frames (two Te and two Tb) even though there are actually two frames (the first frame and the second frame) as illustrated in FIG. 15. Accordingly, from the aspect of user recognition, it is possible to implement a higher frame rate and lower image persistence. Therefore, the motion blur can be reduced or prevented.

The display device 100 may include the pixel array (PXL) existing on the display panel using a glass substrate, and may be a general display in which the source-driving circuit (SDC) and the gate-driving circuit (GDC) are electrically connected to the display panel in various ways.

Unlike this, the display device 100 may be a micro display, which is manufactured to be very small and used for an electronic device such as a virtual-reality device or an augmented-reality device.

Hereinafter, an electronic device using the display device 100 of the micro display type will be described.

Figure 16:
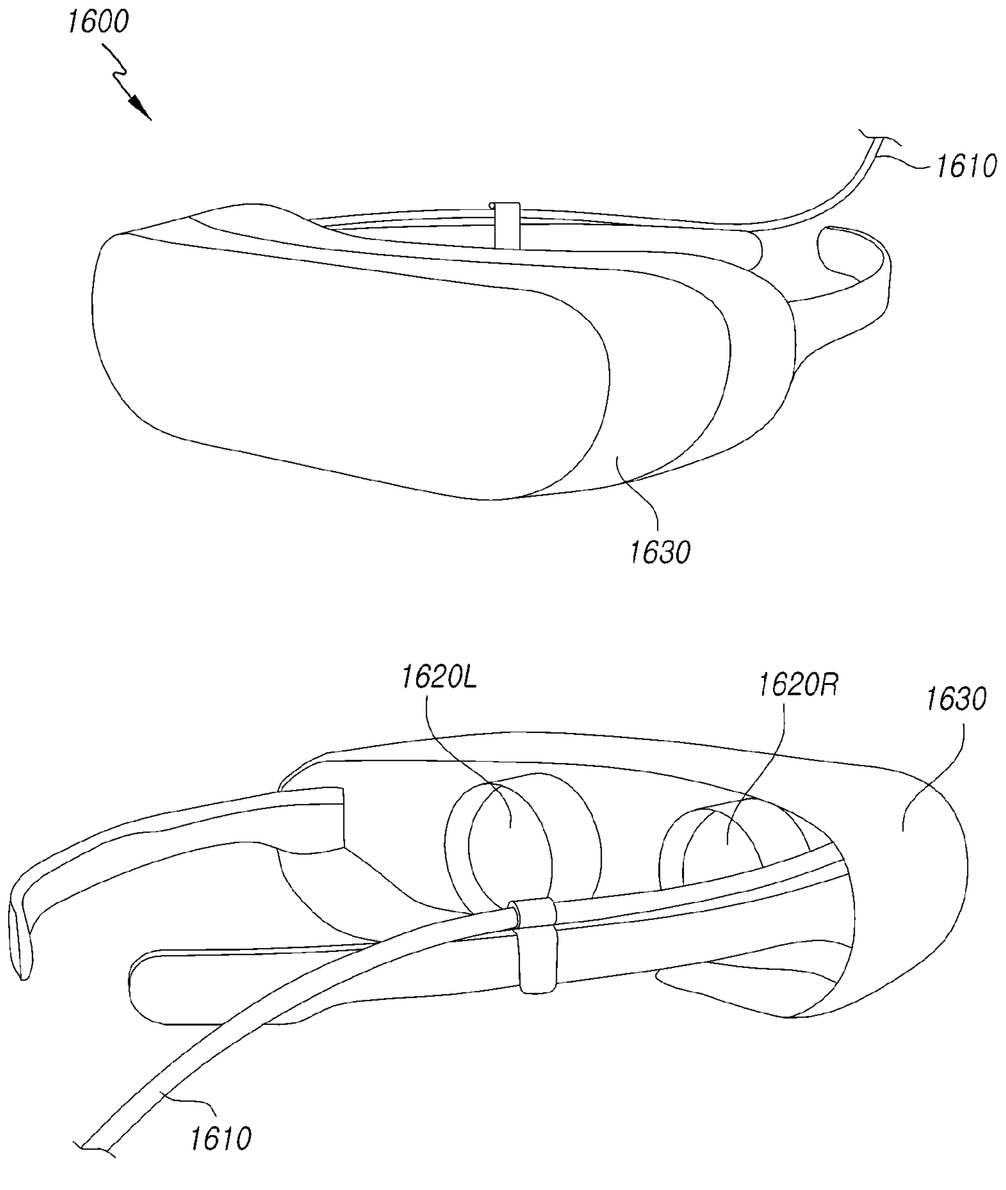
FIG. 16 illustrates an electronic device using the display device according to an aspect of the present disclosure.
Figure 17:
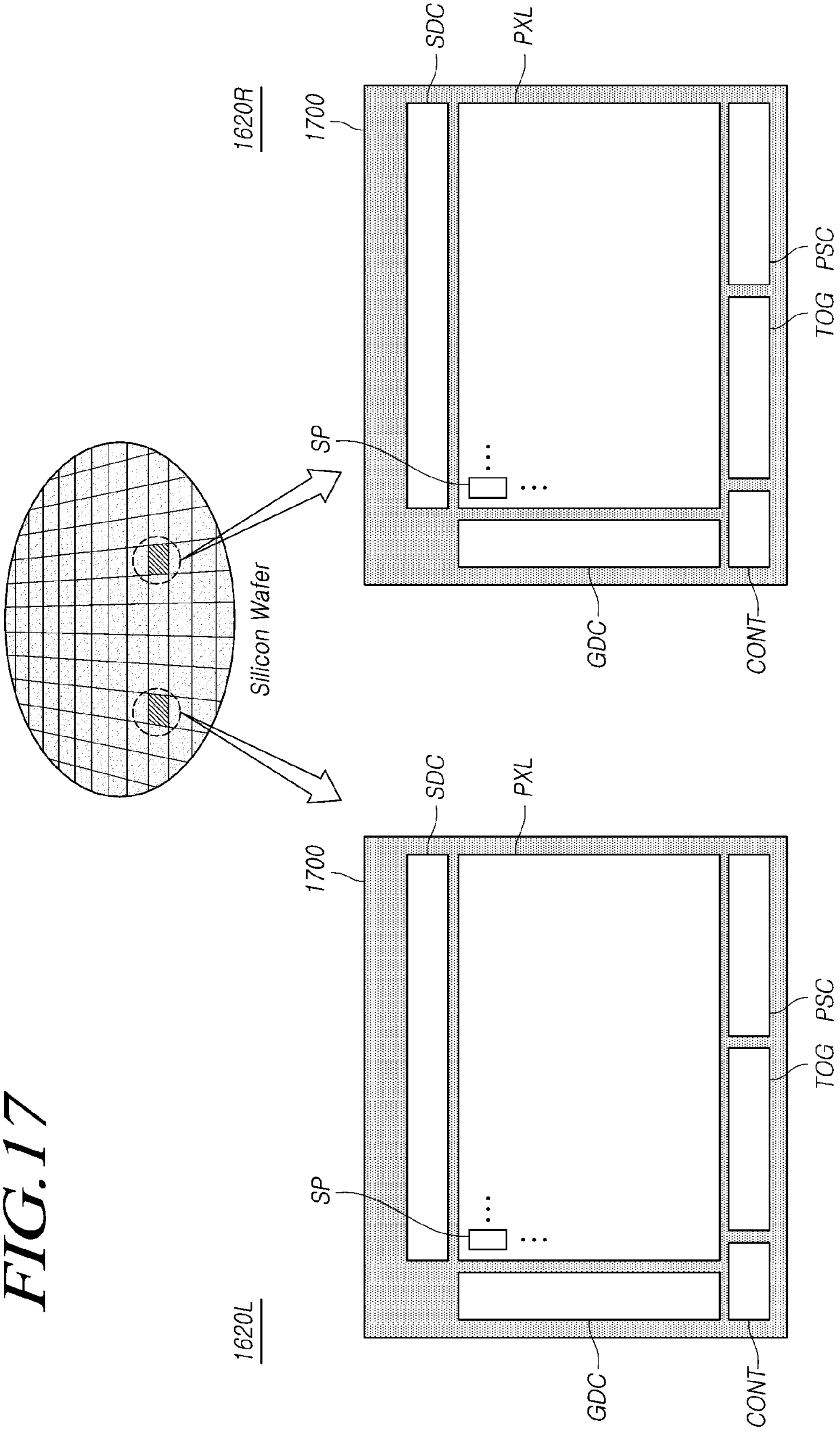
FIG. 17 illustrates implementation examples of a first display unit and a second display unit of the electronic device according to an aspect of the present disclosure.

FIG. 16 illustrates an electronic device using the display device 100 according to the aspect, and FIG. 17 illustrates implementation examples of a first display unit and a second display unit of an electronic device 1600 according to the aspect.

FIG. 16 illustrates the electronic device 1600 using the display device 100 according to the aspect.

Referring to FIG. 16, the electronic device 1600 according to the aspect is a headset-type device for displaying an augmented-reality or virtual-reality image.

The electronic device 1600 according to the aspect may include an image signal input unit 1610 for receiving an image signal, a first display unit 1620L for displaying a first image (for example, a left-eye image) based on an image signal, a second display unit 1620R for displaying a second image (for example, a right-eye image) based on an image signal, an image signal input unit 1610, and a case 1630 for accommodating the first display unit 1620L and the second display unit 1620R.

The image signal input unit 1610 may include a wired cable or a wireless communication module connected to a terminal (for example, a smart phone) for outputting image data.

The first display unit 1620L and the second display unit 1620R are display elements located at positions corresponding to user's left and right eyes.

Each of the first display unit 1620L and the second display unit 1620R may include all or some of the display device 100.

FIG. 17 illustrates implementation examples of the first display unit 1620L and the second display unit 1620R of the electronic device 1600 according to the aspect.

Referring to FIG. 17, each of the first display unit 1620L and the second display unit 1620R of the electronic device 1600 according to the aspect may include a silicon substrate 1700, a pixel array (PXL) including a plurality of subpixels (SP) arranged on a pixel array section of the silicon substrate 1700, and driving circuits (SDC, GDC, and CONT) arranged on a circuit section of the silicon substrate 1700.

The first display unit 1620L and the second display unit 1620R of the electronic device 1600 according to the aspect may be manufactured on the same silicon wafer or different silicon wafers through a semiconductor process.

As described above, the electronic device 1600 according to the aspect may be an augmented-reality device or a virtual-reality device.

Accordingly, using the electronic device 1600 according to the aspect, the user may enjoy more realistic augmented reality or virtual reality.

A power supply circuit (PSC) for supplying various power levels required for each of the first display unit 1620L and the second display unit 1620R of the electronic device 1600 according to the aspect may exist to correspond to each of the first display unit 1620L and the second display unit 1620R. Unlink this, the first display unit 1620L and the second display unit 1620R may share the power supply circuit (PSC).

That is, the number of power supply circuits (PSC) may be one or two.

The power supply circuit (PSC) may be included in the first display unit 1620L and/or the second display unit 1620R. That is, the power supply circuit (PSC) may be located on a silicon substrate 1700 of the first display unit 1620L and/or the second display unit 1620R.

Meanwhile, the power supply circuit (PSC) may include one or more power-related circuits. In this case, part of the power supply circuit (PSC) may exist outside the first display unit 1620L and/or the second display unit 1620R.

Meanwhile, the electronic device 1600 according to the aspect may further include a toggling circuit (TOG) for individually supplying toggled driving voltages (EVDD[1] to EVDD[m]) to a plurality of driving voltage lines (DVL[1] to DVL[m]) arranged in the pixel array area of each of the first display unit 1620L and the second display unit 1620R.

The toggling circuit (TOG) may exist to correspond to each of the first display unit 1620L and the second display unit 1620R.

In this case, as illustrated in FIG. 17, the toggling circuit (TOG) may exist in an external area of the pixel array area (that is, driving circuits (SDC, GDC, and CONT) located near the pixel array (PXL) on the silicon substrate 1700) in each of the first display unit 1620L and the second display unit 1620R.

In each of the first display unit 1620L and the second display unit 1620R, a plurality of driving voltage lines (DVL[1] to DVL[m]) for supplying individual driving voltages (EVDD[1] to EVDD[m]) to a plurality of subpixels (SP) may be arranged in the area in which the pixel array (PXL) is located.

The individual driving voltages (EVDD[1] to EVDD[m]) applied to the plurality of driving voltage lines (DVL[1] to DVL[m]) may be toggled.

As described above, by individually and independently driving the m driving voltage lines (DVL[1] to DVL[m]) using the toggled driving voltages (EVDD[1] to EVDD[m]), it is possible to prevent motion blur from being generated in the electronic device 1600, such as a virtual-reality device or an augmented-reality device.

Further, a period (Tb) during which an image is displayed in black for one or more frame periods may be inserted using black image data (see FIGS. 13 and 15). In this case, additional memory may be required and the transistor size may increase.

However, as described above, the period (Tb) during which the image is displayed in black for one or more frame periods may be inserted through the driving voltage toggling method (see FIGS. 13 and 15). In this case, additional memory is not required and an increase in the transistor size is not required either, and thus a circuit having low power consumption and a small area can be implemented.

Figure 18:
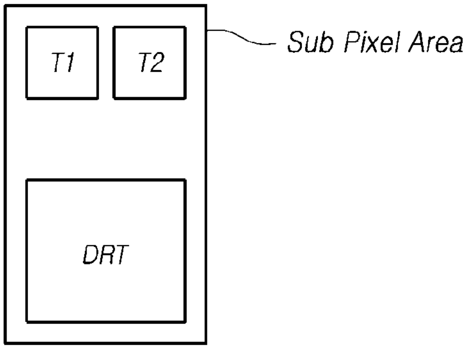
FIG. 18 is a plan view briefly illustrating a subpixel in each of the first display unit and the second display unit of the electronic device according to an aspect of the present disclosure.

FIG. 18 is a plan view briefly illustrating a subpixel in each of the first display unit 1620L and the second display unit 1620R of the electronic device 1600 according to the aspect.

Referring to FIG. 18, in the subpixel structure illustrated in FIG. 3 or 4, three transistors (DRT, T1, and T2) may be arranged in each subpixel area within the pixel array on the silicon substrate 1700.

When the connection structure of FIG. 3 or 4 is satisfied, three transistors (DRT, T1, and T2) may be designed to have various sizes at various locations in each subpixel area.

Since the first display unit 1620L and the second display unit 1620R in the electronic device 1600 are small displays, it is difficult to make a complex subpixel structure in the pixel array area.

Since the first display unit 1620L and the second display unit 1620R in the electronic device 1600 are small displays, it is difficult to arrange the toggling circuit (TOG) in the pixel array area.

Figure 19:
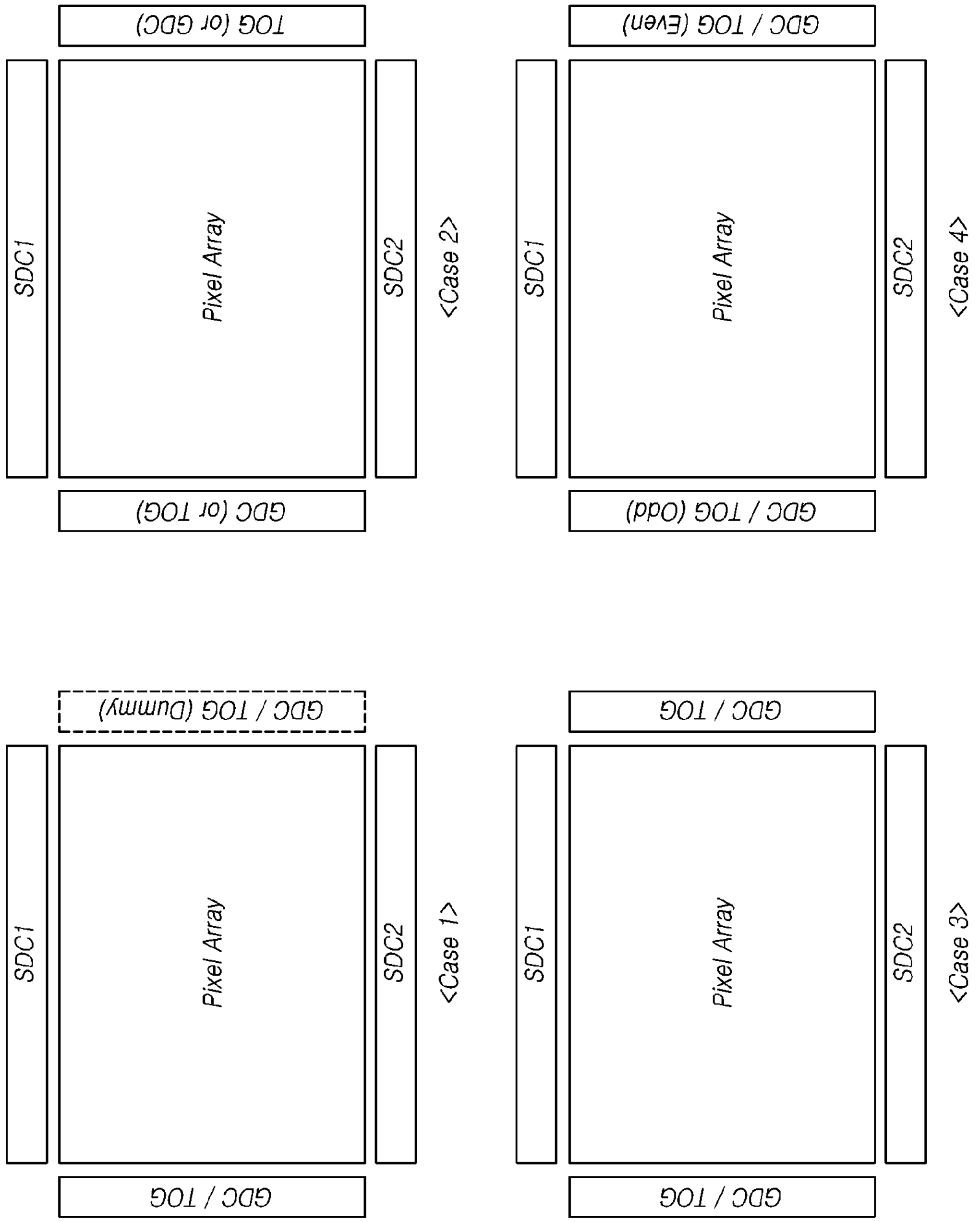
FIG. 19 illustrates four arrangement examples (cases 1, 2, 3, and 4) of driving circuits in each of the first display unit and the second display unit of the electronic device according to an aspect of the present disclosure.

Accordingly, in each of the first display unit 1620L and the second display unit 1620R of the electronic device 1600, the toggling circuit (TOG) may be arranged near the pixel array area, as illustrated in FIG. 19.

Figure 20:
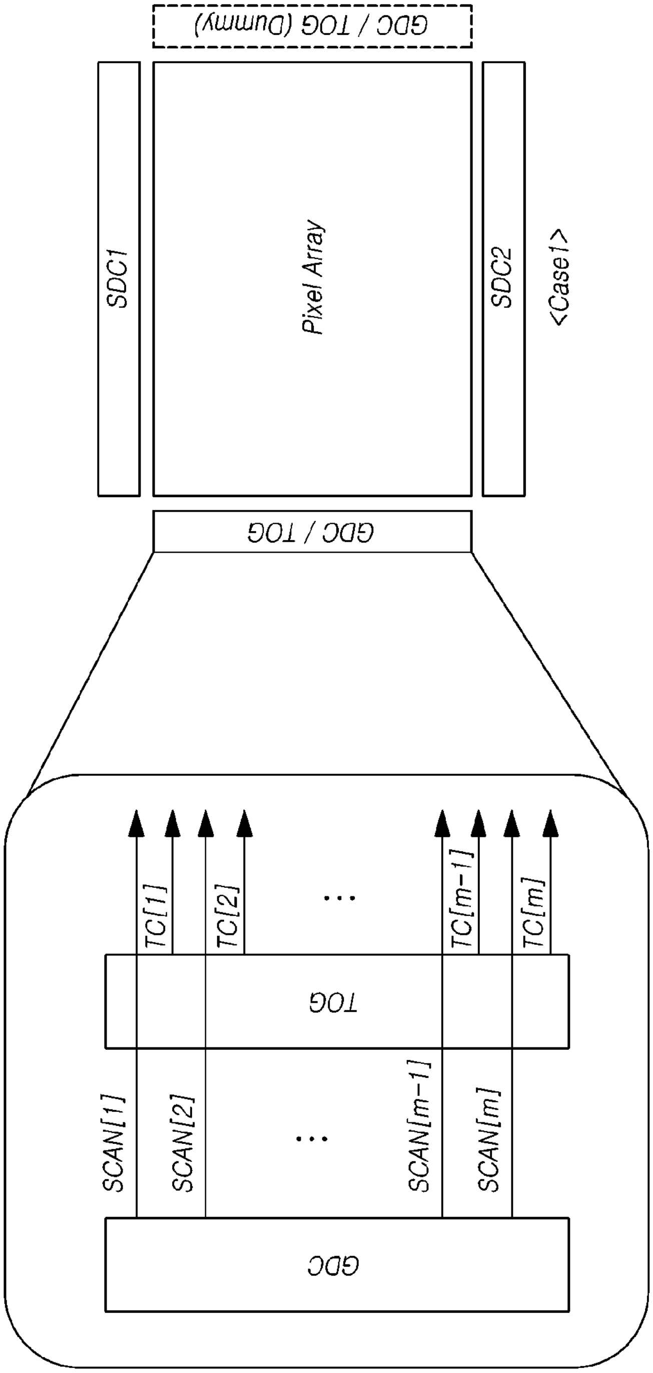
FIG. 20 illustrates signals output from a gate-driving circuit and a toggling circuit according to case 1 of FIG. 19.
Figure 21:
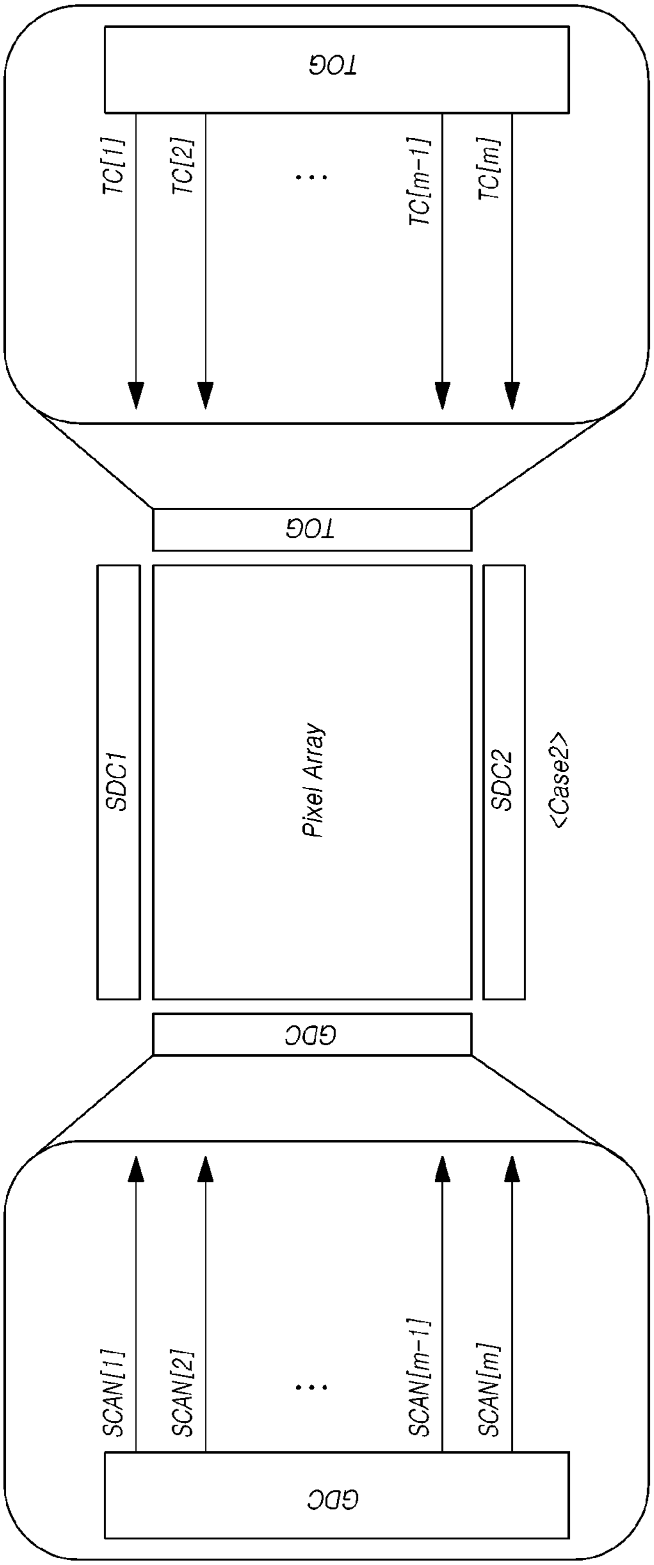
FIG. 21 illustrates signals output from a gate-driving circuit and a toggling circuit according to case 2 of FIG. 19.
Figure 22:
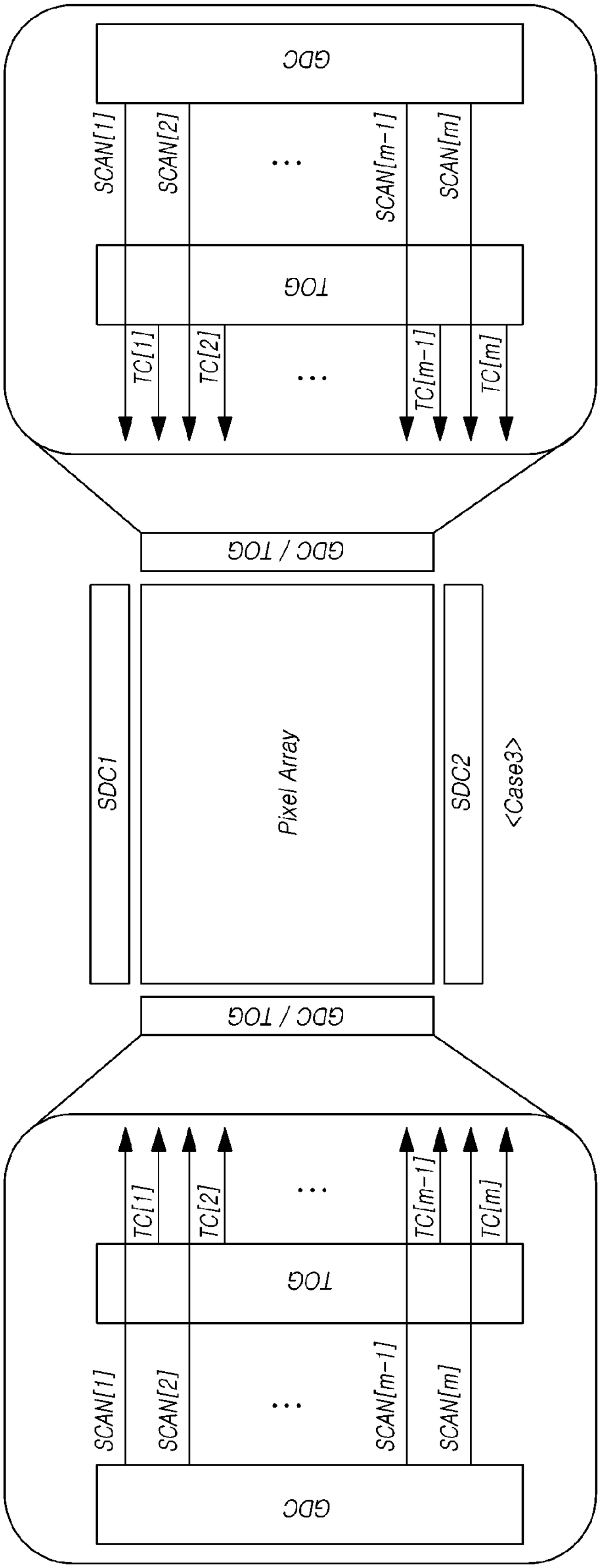
FIG. 22 illustrates signals output from two gate-driving circuits and two toggling circuits according to case 3 of FIG. 19.
Figure 23:
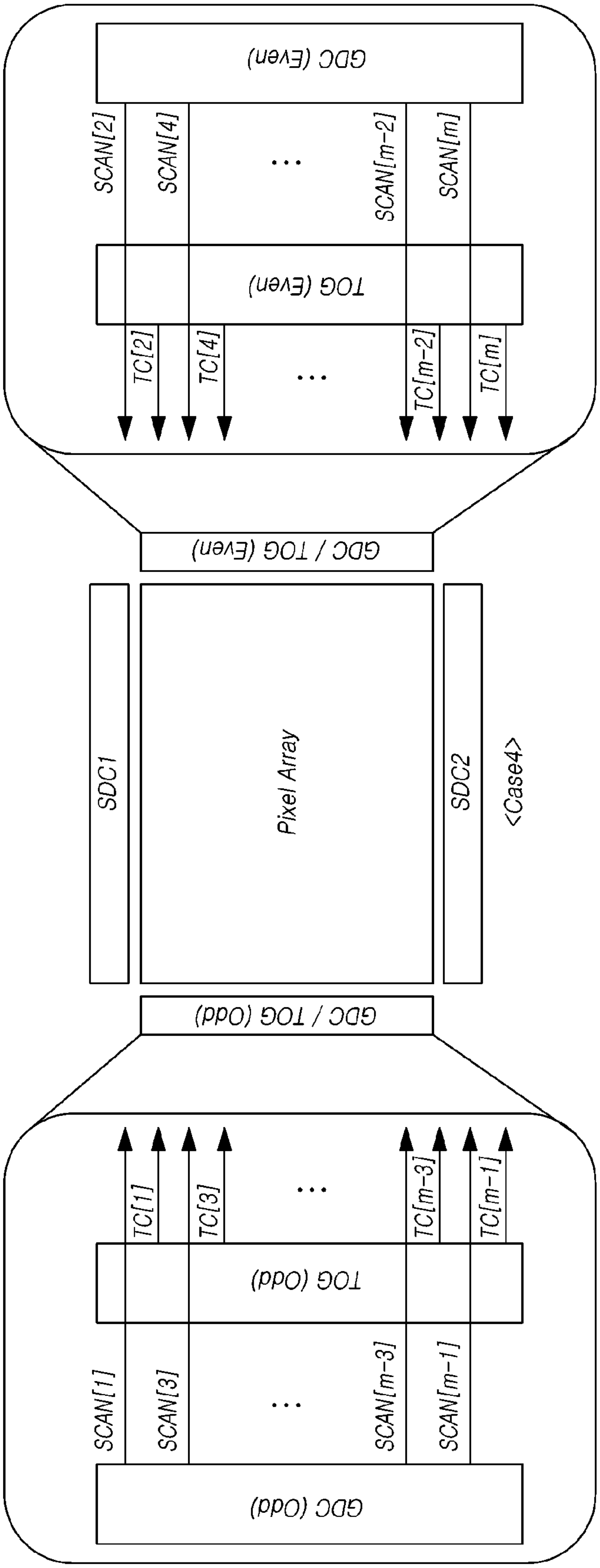
FIG. 23 illustrates signals output from two gate-driving circuits and two toggling circuits according to case 4 of FIG. 19.

FIG. 19 illustrates four arrangement examples (cases 1, 2, 3, and 4) of driving circuits in each of the first display unit 1620L and the second display unit 1620R of the electronic device 1600 according to the aspect. FIG. 20 illustrates signals output from the gate-driving circuit (GDC) and the toggling circuit (TOG) according to case 1 of FIG. 19, FIG. 21 illustrates signals output from the gate-driving circuit (GDC) and the toggling circuit (TOG) according to case 2 of FIG. 19, FIG. 22 illustrates signals output from two gate-driving circuits (GDC) and two toggling circuits (TOG) according to case 3 of FIG. 19, and FIG. 23 illustrates signals output from two gate-driving circuits (GDC) and two toggling circuits (TOG) according to case 4 of FIG. 19.

Referring to FIG. 19, the source-driving circuit (SDC) may include a first source-driving circuit (SDC1) for driving data lines of an odd-numbered channel and a second source-driving circuit (SDC2) for driving data lines of an even-numbered channel.

Without such a division, the source-driving circuit (SDC) may be implemented as a single circuit.

Referring to FIGS. 19 and 20, in case 1, the gate-driving circuit (GDC) for driving all gate lines and the toggling circuit (TOG) for driving all driving voltage lines may exist only on one side (for example, the left side or the right side) of the pixel array area on the silicon substrate 1700.

As necessary, the gate-driving circuit (GDC) and the toggling circuit (TOG), which are dummy circuits that do not actually operate, may exist only on the other side (for example, the right side or the left side) of the pixel array area on the silicon substrate 1700.

Referring to FIGS. 19 and 21, in case 2, the gate-driving circuit (GDC) for driving all gate lines may exist on one side (for example, the left side or the right side) of the pixel array area on the silicon substrate 1700.

The toggling circuit (TOG) for driving all driving voltage lines may exist on the other side (for example, the right side or the left side) of the pixel array area on the silicon substrate 1700.

Referring to FIGS. 19 and 22, in case 3, the gate-driving circuit (GDC) for driving all gate lines and the toggling circuit (TOG) for driving all driving voltage lines may exist both on one side (for example, the left side or the right side) and the other side (for example, the right side or the left side) of the pixel array area on the silicon substrate 1700.

Referring to FIGS. 19 and 23, in case 4, the gate-driving circuit (GDC) for driving odd-numbered gate lines and the toggling circuit (TOG) for driving odd-numbered driving voltage lines may exist on one side (for example, the left side or the right side) of the pixel array area on the silicon substrate 1700.

The gate-driving circuit (GDC) for driving even-numbered gate lines and the toggling circuit (TOG) for driving odd-numbered driving voltage lines may exist on one side (for example, the left side or the right side) of the pixel array area on the silicon substrate 1700.

According to various aspect described above, the display device 100, the electronic device 1600, and the toggling circuit (TOG), which reduce or prevent the motion blur phenomenon, can be provided without a significant change in the performance of the interface, the controller, or the source-driving circuit.

According to the aspect, the display device 100, the electronic device 1600, and the toggling circuit (TOG), which have a high frame rate, a rapid response speed, and low image persistence, can be provided without a significant change in the performance of the interface, the controller, or the source-driving circuit.

According to the aspect, the display device 100, the electronic device 1600, and the toggling circuit (TOG) that individually drive each of a plurality of driving voltage lines can be provided.

According to the aspect, the display device 100, the electronic device 1600, and the toggling circuit (TOG) that individually drive each of a plurality of driving voltage lines using toggled driving voltages can be provided.

According to the aspect, the display device 100, the electronic device 1600, and the toggling circuit (TOG) using the rolling shutter-driving method, which can reduce or prevent a motion blur phenomenon, can be provided.

According to the aspect, the display device 100, the electronic device 1600, and the toggling circuit (TOG) using the global shutter-driving method, which can reduce or prevent the motion blur phenomenon, can be provided.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display device comprising:

a pixel array disposed in a pixel array area and including a plurality of subpixels each having a subpixel line defined by a plurality of data lines and a plurality of gate lines;

a source-driving circuit configured to drive the plurality of data lines;

a gate-driving circuit configured to drive the plurality of gate lines;

a controller configured to control the source-driving circuit and the gate-driving circuit;

a plurality of driving voltage lines individually transferring driving voltages to the plurality of subpixels arranged in the pixel array area; and a toggling circuit including a plurality of shift registers and a plurality of toggle switches connected with one to one correspondence and configured to toggle the driving voltages individually applied to each of the plurality of driving voltage lines by repeating input and non-input of the driving voltages through the plurality of toggle switches in accordance with a plurality of toggle control signals generated by the plurality of shift registers based on a reference signal, which is a reference of a toggle control signal, and output the toggled driving voltages, wherein the plurality of toggle switches is directly connected with the plurality of shift registers, wherein the driving voltages individually applied to each of the plurality of driving voltage lines are toggled by being synchronized with toggling timing of toggle control signals, and a length of an emission period corresponds to a length of an on-voltage state period of each of the toggle control signals and corresponds to a length of a high-level period of the reference signal (REF), and wherein the length of the emission period is substantially longer than the length of a non-emission period in each frame when the toggled driving voltages are applied at different times, and the length of the non-emission period substantially longer than the length of the emission period in each frame when the toggled driving voltages are applied at a same time.

2. The display device of claim 1, wherein each of the plurality of driving voltage lines is arranged to correspond to the subpixel line.

3. The display device of claim 1, wherein each of the plurality of driving voltage lines is arranged to correspond to two or more subpixel lines.

4. The display device of claim 1, wherein the toggled driving voltages applied to the plurality of driving voltage lines have different toggling timings, and the toggled driving voltages applied to the plurality of driving voltage lines are sequentially toggled from an on-voltage level state to an off-voltage level state or a floating state within one frame period.

5. The display device of claim 1, wherein the toggled driving voltages applied to the plurality of driving voltage lines have an equal toggling timing, and the toggled driving voltages applied to the plurality of driving voltage lines are simultaneously toggled from an off-voltage level state or a floating state to an on-voltage state within one frame period.

6. The display device of claim 1, wherein, during a predetermined period of at least one frame period, an image is not displayed, or a fake image, different from the image, is displayed, and the predetermined period is synchronized with a toggling timing of the driving voltages.

7. The display device of claim 6, wherein a beginning time of the predetermined period is shifted for each of the plurality of subpixel lines corresponding to the plurality of driving voltage lines, and in the plurality of subpixel lines corresponding to the plurality of driving voltage lines, the image is not sequentially displayed, or the fake image different from the image is sequentially displayed during the predetermined period.

8. The display device of claim 6, wherein a beginning time of the predetermined period is equal for each of the plurality of subpixel lines corresponding to the plurality of driving voltage lines, and in the plurality of subpixel lines corresponding to the plurality of driving voltage lines, the image is not simultaneously displayed, or the fake image different from the image is simultaneously displayed during the predetermined period.

9. The display device of claim 6, wherein an area in which the image is not displayed or in which the fake image is displayed for a predetermined period is displayed in black.

10. The display device of claim 1, wherein each of the plurality of toggle switches is turned on/off according to the toggle control signal, and toggles the driving voltage input to an input terminal and outputs the toggled driving voltage to the corresponding driving voltage line.

11. The display device of claim 10, wherein the toggling circuit is arranged in an outer area of the pixel array area.

12. The display device of claim 1, wherein the pixel array, the source-driving circuit, the gate-driving circuit, and the controller are arranged on a silicon substrate.

13. The display device of claim 1, wherein each of the plurality of subpixels comprises an organic light-emitting diode, a driving transistor for driving the organic light-emitting diode, and a switching transistor for transferring a data voltage to a gate node of the driving transistor, and a toggled driving voltage is applied to a drain node or a source node of the driving transistor.

14. A display device comprising:

a pixel array comprising a plurality of subpixels defined by a plurality of data lines and a plurality of gate lines;

a source-driving circuit configured to drive the plurality of data lines;

a gate-driving circuit configured to drive the plurality of gate lines;

a controller configured to control the source-driving circuit and the gate-driving circuit and a plurality of driving voltage lines individually transferring driving voltages to the plurality of subpixels; and a toggling circuit including a plurality of shift registers and a plurality of toggle switches connected with one to one correspondence and configured to toggle the driving voltages individually applied to each of the plurality of driving voltage lines by repeating input and non-input of the driving voltages through a plurality of toggle switches in accordance with a plurality of toggle control signals generated by a plurality of shift registers based on a reference signal, which is a reference of a toggle control signal, and output the toggled driving voltages, wherein the plurality of toggle switches is directly connected with the plurality of shift registers, wherein an image is not displayed, or a fake image different from the image is displayed during a predetermined period of at least one frame period, and wherein the driving voltages individually applied to each of the plurality of driving voltage lines are toggled by being synchronized with toggling timing of toggle control signals, and a length of the emission period corresponds to a length of the on-voltage state period of each of the toggle control signals and corresponds to a length of a high-level period of the reference signal (REF), and wherein the length of the emission period is substantially longer than the length of a non-emission period in each frame when the toggled driving voltages are applied at different times, and the length of the non-emission period substantially longer than the length of the emission period in each frame when the toggled driving voltages are applied at a same time.

15. The display device of claim 14, further comprising a plurality of driving voltage lines for transferring individual driving voltages to the plurality of subpixels arranged in a pixel array area including the pixel array, and the driving voltages individually applied to each of the plurality of driving voltage lines are toggled.

16. The display device of claim 15, wherein the driving voltages have a toggling timing synchronized with the predetermined period of at least one frame period.

17. An electronic device comprising:

an image signal input unit configured to receive an image signal;

a first display unit configured to display a first image based on the image signal;

a second display unit configured to display a second image based on the image signal; and a case accommodating the image signal input unit, the first display unit, and the second display unit, wherein each of the first display unit and the second display unit comprises a silicon substrate, a pixel array comprising a plurality of subpixels arranged on the silicon substrate, and driving circuits arranged on the silicon substrate, the driving circuits are located near the pixel array, a plurality of driving voltage lines for supplying individual driving voltages to the plurality of subpixels are arranged in an area in which the pixel array is located in each of the first display unit and the second display unit, and the individual driving voltages applied to the plurality of driving voltage lines are toggled by a toggling circuit including a plurality of shift registers and a plurality of toggle switches connected with one to one correspondence to repeat input and non-input of the driving voltages through the plurality of toggle switches in accordance with a plurality of toggle control signals generated by the plurality of shift registers based on a reference signal, which is a reference of a toggle control signal, wherein the plurality of toggle switches is directly connected with the plurality of shift registers, and wherein the driving voltages individually applied to each of the plurality of driving voltage lines are toggled by being synchronized with toggling timing of toggle control signals, and a length of the emission period corresponds to a length of the on-voltage state period of each of the toggle control signals and corresponds to a length of a high-level period of the reference signal (REF), and wherein the length of the emission period is substantially longer than the length of a non-emission period in each frame when the toggled driving voltages are applied at different times, and the length of the non-emission period substantially longer than the length of the emission period in each frame when the toggled driving voltages are applied at a same time.

18. A display device comprising:

a pixel array comprising a plurality of subpixels defined by a plurality of data lines and a plurality of gate lines;

a source-driving circuit configured to drive the plurality of data lines;

a gate-driving circuit configured to drive the plurality of gate lines; and a controller configured to control the source-driving circuit and the gate-driving circuit, wherein the plurality of subpixels is grouped into a plurality of subpixel groups, the plurality of subpixel groups is connected to a plurality of driving voltage lines arranged in the pixel array area, and driving voltages individually applied to the plurality of driving voltage lines are controlled for each of the plurality of subpixel groups by a toggling circuit including a plurality of shift registers and a plurality of toggle switches connected with one to one correspondence to repeat input and non-input of the driving voltages through the plurality of toggle switches in accordance with a plurality of toggle control signals generated by the plurality of shift registers based on a reference signal, which is a reference of a toggle control signal, wherein the plurality of toggle switches is directly connected with the plurality of shift registers, and wherein the driving voltages individually applied to each of the plurality of driving voltage lines are toggled by being synchronized with toggling timing of toggle control signals, and a length of the emission period corresponds to a length of the on-voltage state period of each of the toggle control signals and corresponds to a length of a high-level period of the reference signal (REF), and wherein the length of the emission period is substantially longer than the length of a non-emission period in each frame when the toggled driving voltages are applied at different times, and the length of the non-emission period substantially longer than the length of the emission period in each frame when the toggled driving voltages are applied at a same time.

19. The display device of claim 18, further comprising a driving voltage control circuit configured to control the driving voltages applied to the plurality of driving voltage lines.

20. The display device of claim 18, wherein each of the plurality of toggle switches is turned on/off according to the toggle control signal, toggles the driving voltage input to an input terminal, and outputs the toggled driving voltage to the corresponding driving voltage line, and wherein the plurality of shift registers generates and outputs the toggle control signal based on a reset signal indicating an end or a beginning of a toggle control period, and a clock signal for signal timing.

* * * * *